(12) United States Patent
Su et al.

(10) Patent No.: US 10,810,944 B2
(45) Date of Patent: Oct. 20, 2020

(54) ARRAY SUBSTRATE, DISPLAY PANEL AND DISPLAY DEVICE

(71) Applicant: Shanghai AVIC Optoelectronics Co., Ltd., Shanghai (CN)

(72) Inventors: Chang Su, Shanghai (CN); Huijun Jin, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 244 days.

(21) Appl. No.: 15/906,359

(22) Filed: Feb. 27, 2018

(65) Prior Publication Data

US 2018/0190206 A1    Jul. 5, 2018

(30) Foreign Application Priority Data

Oct. 25, 2017   (CN) .......................... 2017 1 1007459

(51) Int. Cl.
  *G09G 3/3266*   (2016.01)
  *G11C 19/28*   (2006.01)
  (Continued)

(52) U.S. Cl.
  CPC ......... *G09G 3/3266* (2013.01); *G09G 3/3677* (2013.01); *G11C 19/28* (2013.01);
  (Continued)

(58) Field of Classification Search
  CPC .. G09G 3/3225; G09G 3/3266; G09G 3/3677; G09G 2300/0408;
  (Continued)

(56) References Cited

U.S. PATENT DOCUMENTS

| | | | | |
|---|---|---|---|---|
| 8,289,261 B2* | 10/2012 | Lee | ...................... | G09G 3/3266 |
| | | | | 324/333 |
| 8,310,432 B2* | 11/2012 | Lee | ........................ | G11C 19/28 |
| | | | | 345/100 |
| 9,396,682 B2* | 7/2016 | Xia | ....................... | G09G 3/3266 |
| 9,698,176 B1* | 7/2017 | Kumar | .................. | H01L 27/127 |
| 10,217,416 B2* | 2/2019 | Lee | ....................... | G09G 3/3266 |

(Continued)

FOREIGN PATENT DOCUMENTS

| | | |
|---|---|---|
| CN | 1185532 C | 1/2005 |
| CN | 101521201 A | 9/2009 |

(Continued)

*Primary Examiner* — Patrick O Neill
(74) *Attorney, Agent, or Firm* — Anova Law Group PLLC

(57) ABSTRACT

An array substrate, a display panel and a display device are provided. The array substrate has a display area including display transistors and gate lines, and a non-display area surrounding the display area and including a gate driving circuit electrically connected to the gate lines. A display transistor includes a display active layer comprising amorphous silicon. The gate driving circuit includes stages of shift registers. A shift register includes a plurality of shift register transistors, a gate signal output terminal, and at least one bootstrap point. The shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon.

16 Claims, 11 Drawing Sheets

(51) Int. Cl.
*H01L 27/12* (2006.01)
*G09G 3/36* (2006.01)
*G09G 3/3225* (2016.01)

(52) U.S. Cl.
CPC ...... *H01L 27/1229* (2013.01); *H01L 27/1233* (2013.01); *H01L 27/1285* (2013.01); *G09G 3/3225* (2013.01); *G09G 2300/0408* (2013.01); *G09G 2310/0286* (2013.01); *G09G 2320/0214* (2013.01)

(58) Field of Classification Search
CPC ... G09G 2310/0286; G09G 2320/0214; G11C 19/28; H01L 27/1229; H01L 27/1233; H01L 27/1285
See application file for complete search history.

(56) References Cited

U.S. PATENT DOCUMENTS

| | | | | |
|---|---|---|---|---|
| 10,529,745 | B2* | 1/2020 | Lee | H01L 27/1225 |
| 2001/0038099 | A1* | 11/2001 | Yamazaki | H01L 27/1214 |
| | | | | 257/72 |
| 2010/0327285 | A1* | 12/2010 | Yamamoto | H01L 21/268 |
| | | | | 257/59 |
| 2018/0308444 | A1* | 10/2018 | Sueki | G11C 19/28 |

FOREIGN PATENT DOCUMENTS

| | | |
|---|---|---|
| CN | 101639598 A | 2/2010 |
| CN | 103985346 A | 8/2014 |
| CN | 103985363 A | 8/2014 |
| CN | 104538352 A | 4/2015 |

* cited by examiner

__US 10,810,944 B2__

1

ARRAY SUBSTRATE, DISPLAY PANEL AND DISPLAY DEVICE

CROSS-REFERENCES TO RELATED APPLICATIONS

This application claims the priority of Chinese Patent Application No. 201711007459.4, filed on Oct. 25, 2017, the entire contents of which are incorporated herein by reference.

FIELD OF THE DISCLOSURE

The present disclosure generally relates to the display technology and, more particularly, relates to an array substrate, a display panel and a display device thereof.

BACKGROUND

Thin-film transistors (TFTs) have been widely used in the field of display technology. An existing array substrate often includes a display area and a non-display area. The display area is disposed with a plurality of gate lines, and the non-display area is disposed with a gate driving circuit, which provides an electrical signal to the gate lines. The gate driving circuit includes a plurality of stages of shift registers each having a plurality of TFTs.

FIG. 1 illustrate a schematic diagram of an existing thin-film transistor (TFT). Referring to FIG. 1, the existing TFT includes a gate electrode 01, an active layer 02, a source electrode 03, and a drain electrode 04. According to the material of the active layer 02, the TFTs can be divided into polycrystalline silicon/polysilicon transistors and amorphous silicon transistors.

Because the technology of manufacturing the amorphous silicon transistor is relatively mature and the cost is relatively low, the TFTs in the shift register in the existing array substrate are all amorphous silicon transistors.

TFTs are operated in an ON-state and an OFF-state. ON-state current $I_{on}$ charges and discharges the TFT. The larger the current is, the faster the charge and discharge of the TFT will be. Therefore, the ON-state current $I_{on}$ is also called as the working current, which is desired to be as large as possible. The current in the OFF-state affects the degree of leakage, and an ideal TFT should have no current in the OFF-state. Therefore, the OFF current $I_{off}$ is also called as the leakage current, which is desired to be as small as possible.

In the existing technology, the amorphous silicon transistor has a simple fabrication process, however, due to the low electron mobility of the amorphous silicon transistor, the ON-state current $I_{on}$ and the OFF-state current $I_{off}$ are both substantially small. Although the substantially small OFF-state current $I_{off}$ effectively reduces the leakage current, the substantially small ON-state current $I_{on}$ degrades the ON-state performance of the amorphous silicon transistor.

In addition, the amorphous silicon transistor has a substantially large size, occupying a substantially large area of the non-display area, which may not facilitate a narrow border/edge/bezel design of the display device.

The disclosed array substrate, display panel and display device thereof are directed to solve one or more problems set forth above and other problems.

BRIEF SUMMARY OF THE DISCLOSURE

One aspect of the present disclosure provides an array substrate. The array substrate comprises a display area including a plurality of display transistors and a plurality of gate lines, and a non-display area surrounding the display area and including a gate driving circuit electrically connected to the plurality of gate lines. A display transistor includes a display active layer comprising amorphous silicon. The gate driving circuit includes a plurality of stages of shift registers. A shift register includes a plurality of shift register transistors, a gate signal output terminal, and at least one bootstrap point. The plurality of shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon.

Another aspect of the present disclosure provides a display panel comprising an array substrate. The array substrate comprises a display area including a plurality of display transistors and a plurality of gate lines, and a non-display area surrounding the display area and including a gate driving circuit electrically connected to the plurality of gate lines. A display transistor includes a display active layer comprising amorphous silicon. The gate driving circuit includes a plurality of stages of shift registers. A shift register includes a plurality of shift register transistors, a gate signal output terminal, and at least one bootstrap point. The plurality of shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon.

Another aspect of the present disclosure provides a display device. The display device comprises a display panel comprising an array substrate. The array substrate comprises a display area including a plurality of display transistors and a plurality of gate lines, and a non-display area surrounding the display area and including a gate driving circuit electrically connected to the plurality of gate lines. A display transistor includes a display active layer comprising amorphous silicon. The gate driving circuit includes a plurality of stages of shift registers. A shift register includes a plurality of shift register transistors, a gate signal output terminal, and at least one bootstrap point. The plurality of shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
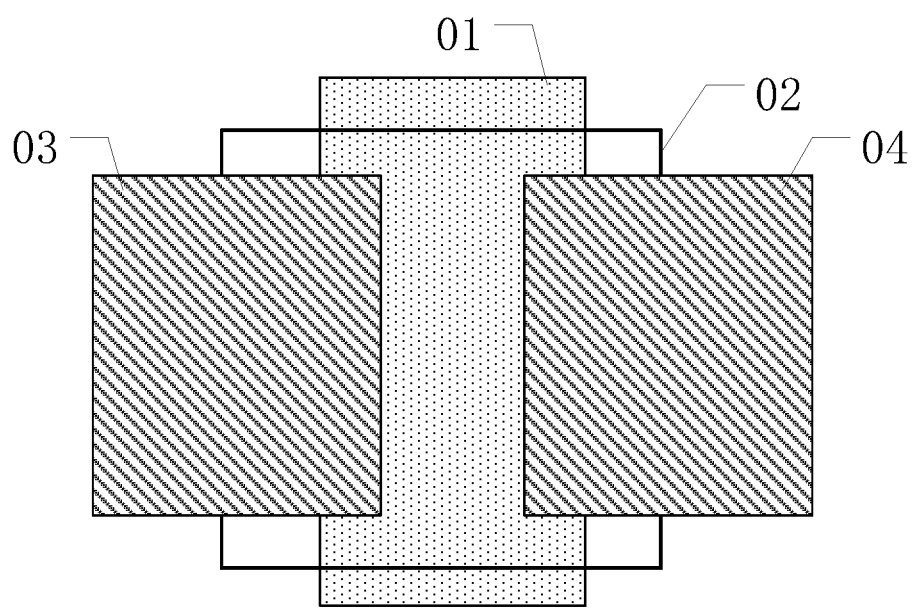
FIG. 1 illustrate a schematic diagram of an existing thin-film transistor (TFT)

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted. It should be noted that the relative arrangement of the components and steps, the numerical expressions, and numerical values set forth in the exemplary embodiments do not limit the scope of the present disclosure unless it is specifically stated otherwise.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides an improve array substrate, display panel and display device, which are able to reduce the area occupied by the gate driving circuit in the non-display area, thereby realizing a narrow border/edge of the display device.

Figure 2:
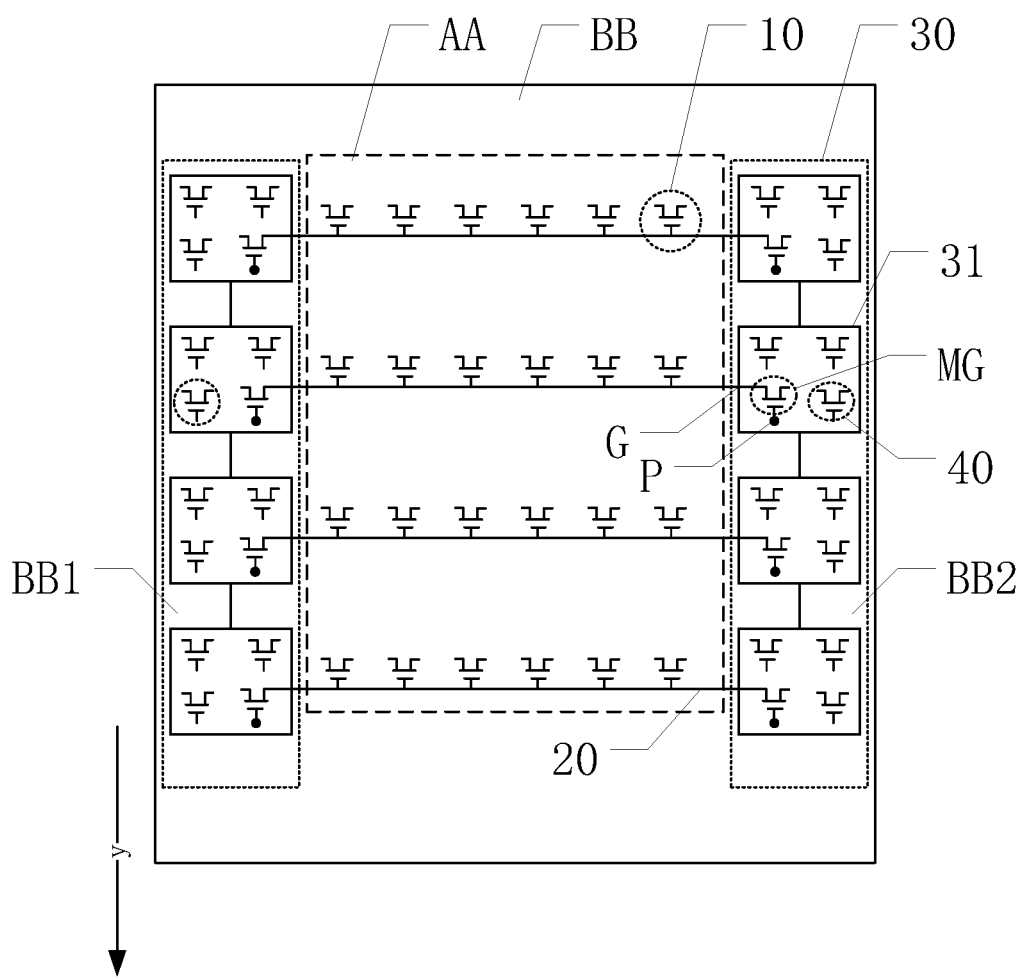
FIG. 2 illustrates a top view of an exemplary array substrate consistent with disclosed embodiments.
Figure 3:
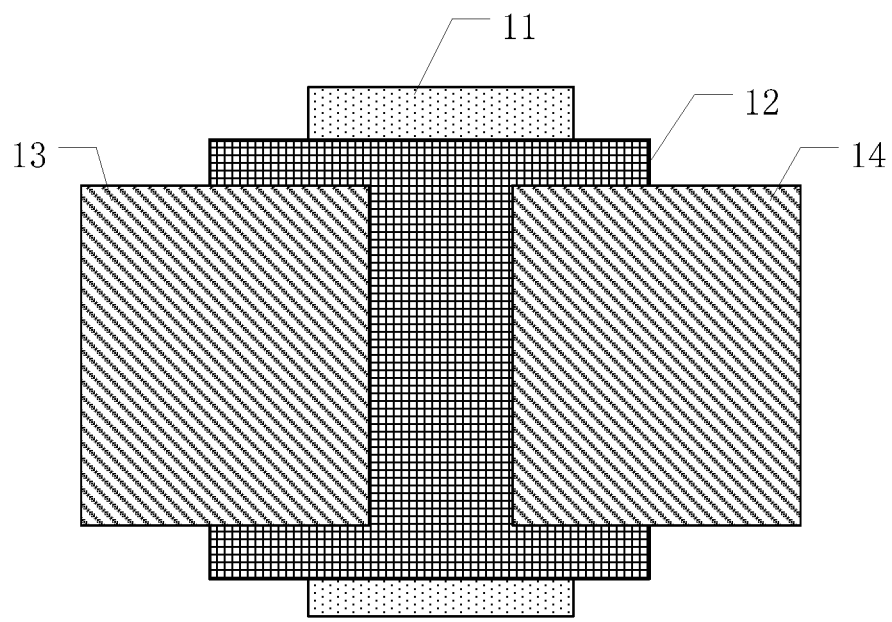
FIG. 3 illustrates a schematic diagram of an exemplary display transistor in an exemplary array substrate in FIG. 2 consistent with disclosed embodiments.
Figure 4:
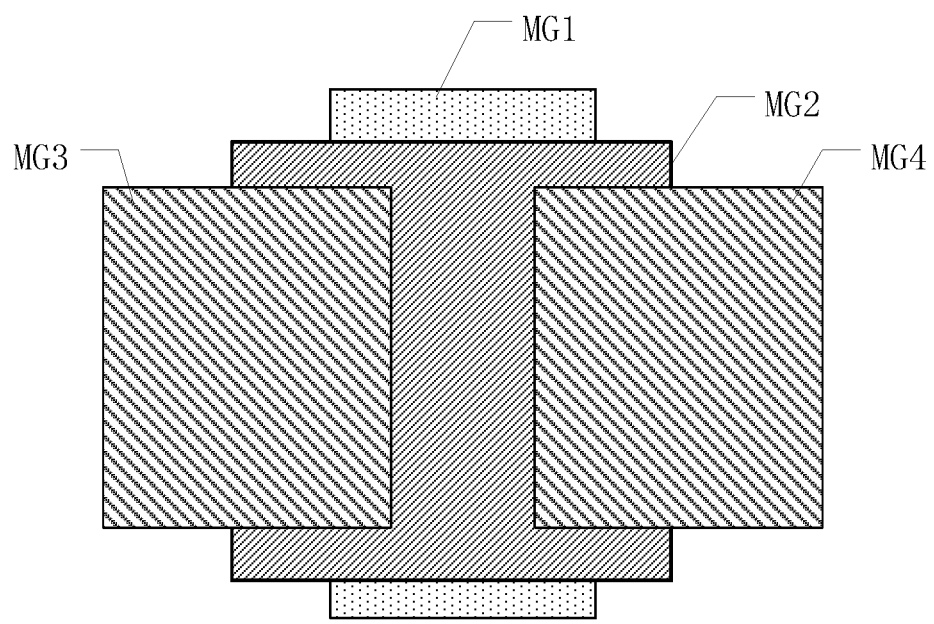
FIG. 4 illustrates a schematic diagram of an exemplary gate output transistor in an exemplary array substrate in FIG. 2 consistent with disclosed embodiments.

FIG. 2 illustrates a top view of an exemplary array substrate consistent with disclosed embodiments. FIG. 3 illustrates a schematic diagram of an exemplary display transistor in an exemplary array substrate in FIG. 2 consistent with disclosed embodiments. FIG. 4 illustrates a schematic diagram of an exemplary gate output transistor in an exemplary array substrate in FIG. 2 consistent with disclosed embodiments.

As shown in FIGS. 2-4, the array substrate may include a display area AA and a non-display area BB surrounding the display area AA. The display area AA may include a plurality of display transistors 10. The display transistor 10 may include a display active layer 12, which may include a material of amorphous silicon. In addition, the display transistor 10 may further include a gate electrode 11, a first electrode 13, and a second electrode 14, in which the first electrode 13 may be one of the source electrode and the drain electrode of the display transistor 10, and the second electrode 14 may be the other of the source electrode and the drain electrode of the display transistor 10.

The display transistor 10 may be configured to realize a display function. In particular, the display area AA may include a plurality of pixels and a plurality of gate lines 20. The pixel may include a pixel electrode, and the display transistor 10 may be electrically connected with the pixel electrode. The gate electrode 11 of the display transistor 10 may be point-connected to the gate line 20. The gate line 20 may be configured to transmit an electrical signal to control the display transistor 10 to be turned on and off.

The non-display area BB may include a gate driving circuit 30 electrically connected to the plurality of gate lines 20. The gate driving circuit 30 may include a plurality of stages of shift registers 31. The gate driving circuit 30 may be integrated in the array substrate. In the fabrication process of the array substrate, the film structure in the array substrate may be used to form various electron components and wirings in the gate driving circuit 30 through a patterning process.

Further, the non-display area BB may include a first side bezel area BB1 and a second side bezel area BB2. The first side bezel area BB1 and the second side bezel area BB2 may be respectively disposed on two sides of the display area AA. The gate driving circuit 30 may be arranged in the non-display area BB in various ways.

In one embodiment, as shown in FIG. 2, the gate driving circuit 30 may be disposed on both the first side bezel region BB1 and the second side bezel region BB2. Both ends of the same gate line 20 may be electrically connected to the gate driving circuit 30. The gate line 20 may simultaneously receive signals at both ends, such that the signal along the gate line 20 may be substantially uniform.

Figure 5:
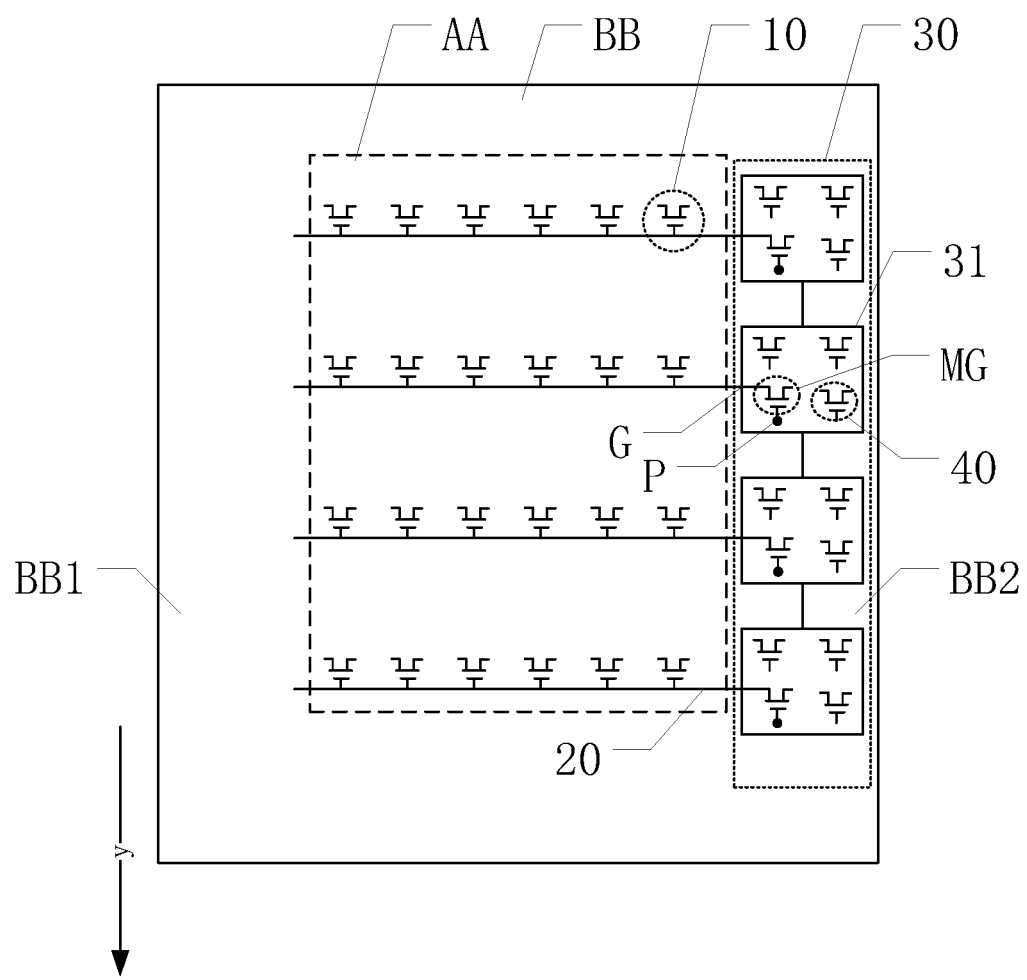
FIG. 5 illustrates a top view of another exemplary array substrate consistent with disclosed embodiments.

In another embodiment, the gate driving circuit 30 may be disposed only in the bezel area arranged on one side of the display area AA. FIG. 5 illustrates a top view of another exemplary array substrate consistent with disclosed embodiments. As shown in FIG. 5, the gate driving circuit 30 may be disposed only in the second side bezel area BB2. That is, the gate driving circuit 30 may be disposed in the non-display area BB arranged on one side of the display area AA. In particular, the gate driving circuit 30 may be disposed on the second side bezel area BB2, such that the first side bezel area BB1 may be saved for other components. In another embodiment, the gate driving circuit 30 may be disposed only in the first side bezel area BB1.

Figure 6:
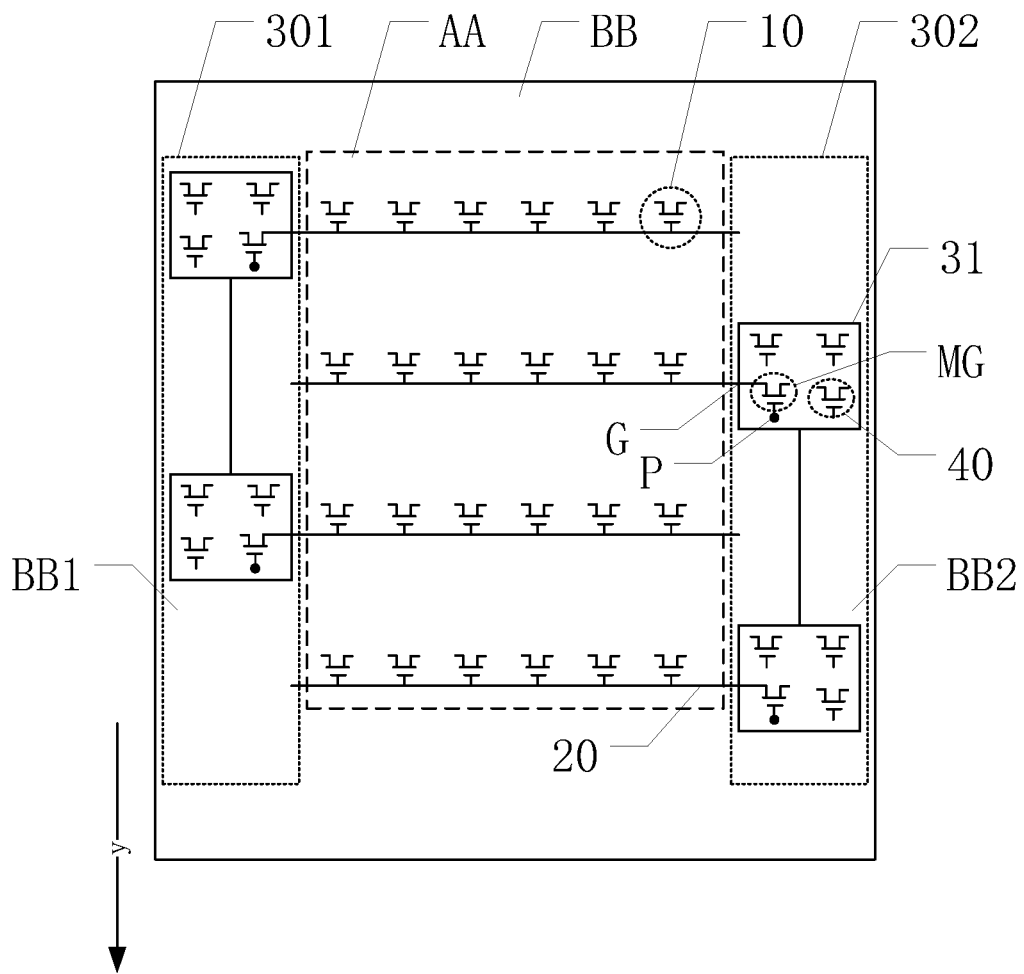
FIG. 6 illustrates a top view of another exemplary array substrate consistent with disclosed embodiments.

FIG. 6 illustrates a top view of another exemplary array substrate consistent with disclosed embodiments. As shown in FIG. 6, the gate driving circuit 30 may include a first sub-gate driving circuit 301 and a second sub-gate driving circuit 302. The first sub-gate driving circuit 301 may be disposed in the first side bezel area BB1, and may be electrically connected with the odd-numbered gate lines 20 (i.e., the gate lines 20 in the odd-numbered rows). The second sub-gate driving circuit 302 may be disposed in the second side bezel area BB2, and may be electrically connected with the even-numbered gate lines 20 (i.e., the gate lines 20 in the even-numbered rows).

FIG. 5 and FIG. 6 illustrate different arrangements of the gate driving circuit, which are for illustrative purposes and are not intended to limit the scope of the present disclosure. In practical applications, the gate driving circuit may be arranged according to various application scenarios, which is not limited by the present disclosure. The electrical connection among the plurality of stages of shift registers 31 may be determined according to various application scenarios, which is not limited by the present disclosure.

Returning to FIG. 2, in the gate driving circuit 30, each stage of the shift registers 31 may include a plurality of cascaded shift register transistors 40, a gate signal output terminal G, and a bootstrap point P. FIG. 2 only shows each shift register 31 includes four shift register transistors 40, which is for illustrative purposes and is not intended to limit the scope of the present disclosure. In practical applications, the number of the shift register transistors in each shift register 31 in the gate driving circuit 30 may be determined according to various application scenarios, which is not limited by the present disclosure. In addition, in each shift register 31, the electrical connection between the plurality of shift register transistors 40 may be determined according to various application scenarios, which is not limited by the present disclosure.

The gate signal output terminal G of the shift register 31 may be electrically connected to the gate line 20. The shift register 31 may output an electrical signal to the gate line 20 through the gate signal output terminal G, thereby controlling the turn-on and turn-off of the display transistor 10 electrically connected to the same gate line 20.

In one shift register 31, the plurality of shift register transistors 40 may include at least one gate output transistor MG. Referring to FIG. 2 and FIG. 4, the at least one gate output transistor MG may include a gate output active layer MG2, which may include a material of polysilicon. In addition, the at least one gate output transistor MG may also include a gate electrode MG1, a first electrode MG3, and a second electrode MG4. The first electrode MG3 may be one of the source electrode and the drain electrode of the at least one gate output transistor MG, and the second electrode MG4 may be the other of the source electrode and the drain electrode of the at least one gate output transistor MG. The gate electrode MG1 of the at least one gate output transistor MG may be electrically connected to the bootstrap point P, and the first electrode MG3 of the at least one gate output transistor MG may be electrically connected to the gate signal output terminal G.

In the disclosed embodiments, on one hand, the display transistor 10 may include the display active layer 12 of amorphous silicon. That is, the display transistor 10 may be an amorphous silicon transistor 10 which is featured with mature technology, low cost, and simple production process. In addition, when the display active layer 12 of the display transistor 10 in the display area AA is made of polysilicon instead of amorphous silicon, the leakage current of the display transistor 10 may be increased, resulting a serious crosstalk and degrading the display performance. Therefore, through configuring the display active layer 12 of the display transistor 10 in the display area AA to be made of amorphous silicon instead of polysilicon, the display performance of the display area AA may be ensured.

On the other hand, the at least one gate output transistor MG of the shift register 31 may include the gate output active layer MG2 made of polysilicon. That is, the at least one gate output transistor MG of the shift register 31 may be a polysilicon transistor. In the existing technology, shift registers often adopt amorphous silicon transistors, i.e., all the transistors included in the existing shift register are amorphous silicon transistors. Because the electron mobility of polysilicon is much larger than the electron mobility of amorphous silicon, given the same ON-state current $I_{on}$ and the same OFF-state current $I_{off}$, the area occupied by the polysilicon transistor may be smaller than the area occupied by the amorphous silicon transistor. Thus, compared with the existing array substrate, the disclosed array substrate may be able to reduce the area of the gate output active layer, thereby reducing the area occupied by the at least one gate output transistor, and further reducing the area occupied by the shift register 31 in the non-display area BB.

In disclosed embodiments, the plurality of shift register transistors in each stage of the shift register may include at least one gate output transistor. The at least one gate output transistor may include a gate output active layer including a material of polysilicon. Because the electron mobility of polysilicon is larger than the electron mobility of amorphous silicon, the at least one gate output transistor provided in the disclosed array substrate may have a substantially large ON-state current $I_{on}$, such that the charge and discharge of the at least one gate output transistor may be substantially fast.

Meanwhile, compared with the existing array substrate, the area of the gate output active layer in the disclosed array substrate may be reduced, such that the area occupied by the at least one gate output transistor may be reduced and, accordingly, the area occupied by the gate driving circuit in the non-display area BB may be reduced, which may facilitate the narrow bezel design.

Figure 16:
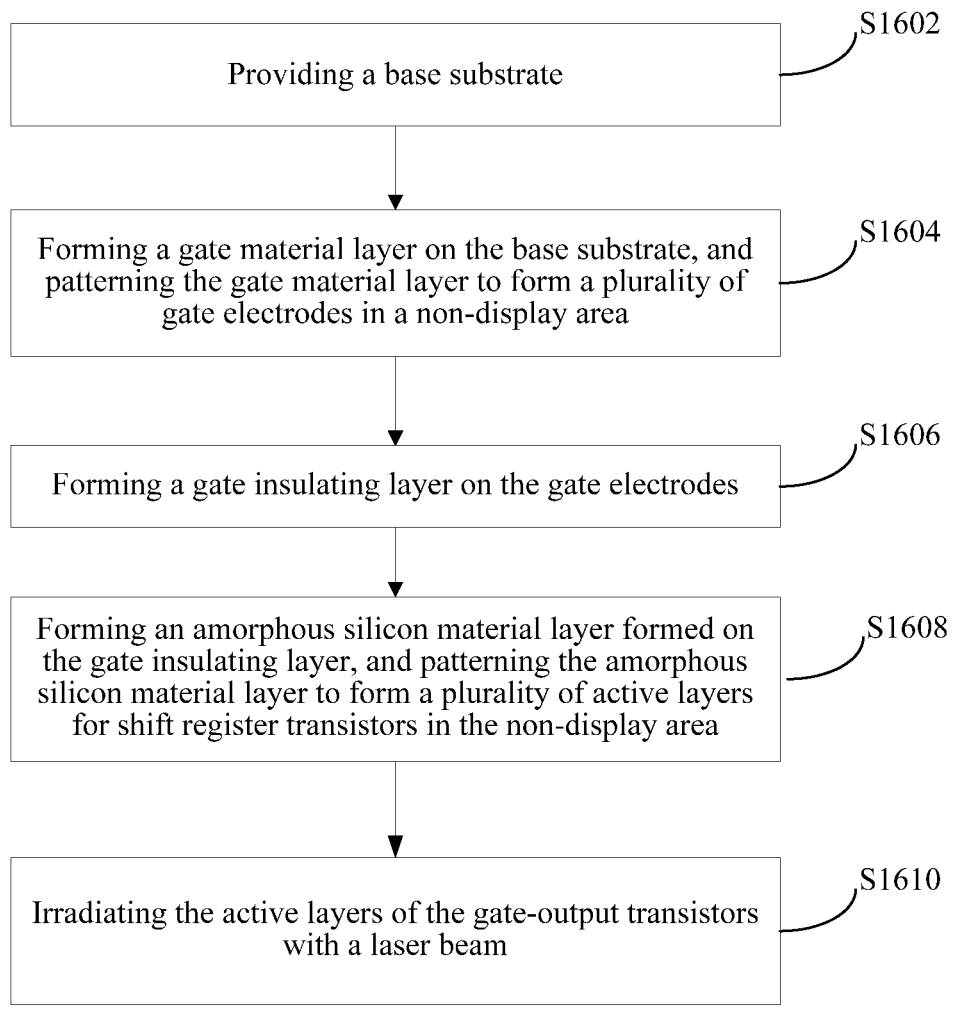
FIG. 16 illustrates a flow chart of an exemplary array substrate fabrication method consistent with disclosed embodiments.

FIG. 16 illustrates a flow chart of an exemplary array substrate fabrication method consistent with disclosed embodiments. As shown in FIG. 16, the array substrate fabrication method may include the following steps.

At the beginning, a base substrate is provided (S1602). The base substrate includes a display area and a non-display area surrounding the display area.

After the base substrate is provided, a gate material layer is formed on the base substrate, and the gate material layer is patterned to form a plurality of gate electrodes in the non-display area (S1604).

After the plurality of gate electrodes are formed in the non-display area, a gate insulating layer is formed on the gate electrodes (S1606).

After the gate insulating layer is formed on the gate electrodes, an amorphous silicon material layer is formed on the gate insulating layer, and the amorphous silicon material layer is patterned to form a plurality of active layers for shift register transistors in the non-display area (S1608). In particular, the plurality of active layers of the shift register transistors may be one-to-one corresponding to the plurality of gate electrodes. In a direction perpendicular to the base substrate, the active layer of the shift register transistor may overlap with the corresponding gate electrode. The shift register transistors may include at least one gate output transistors.

After the active layers of the shift register transistors are formed in the non-display area, the active layers of the at least one gate output transistors are irradiated with a laser beam, such that the material of the active layer of the at least one gate output transistor is converted from amorphous silicon to polysilicon/polysilicon (S1610). The active layer of the at least one gate output transistor may be referred as a gate output active layer, which is an amorphous silicon active layer. The process of converting the material of the active layer of the at least one gate output transistor from amorphous silicon to polysilicon is called the crystallization process of the amorphous silicon active layer.

In one embodiment, irradiating the active layer of the at least one gate output transistor with the laser beam (included in S1610) may include the following steps:

irradiating the active layer of the at least one gate output transistor with a laser beam having an energy density of J1 to dehydrogenate the active layer of the at least one gate output transistor, thereby obtaining a dehydrogenated active layer; and irradiating the dehydrogenation active layer with a laser beam having an energy density of J2 to convert the material of the dehydrogenation active layer into polysilicon, and J2>J1.

In one embodiment, 350 mJ/m² ≤ J1 ≤ 450 mJ/m², 450 mJ/m² ≤ J2 ≤ 650 mJ/m².

In one embodiment, the crystallization process of the amorphous silicon active layer (included in S1610) may include laser annealing the amorphous silicon active layer in the predetermined area by a lens mask/reticle method. In particular, in the disclosed embodiments, the laser annealing process may be performed on a non-crystalline silicon semiconductor layer through the lens mask, because the lens mask is more effective in converging the laser beam, the crystallization of the amorphous silicon active layer may be substantially uniform.

The mask used in the laser annealing may include a light-shielding region and a light-transmitting region. The light-transmitting region may include a plurality of lens groups. The lens group may include a first microlens, a second microlens and a third microlens stacked in layers, and the second microlens may be sandwiched between the first microlens and the third microlens. The focal points of the respective microlens may be located in the same focal plane. Compared with the mask having only one microlens and/or only one microlens layer, a plurality of microlens stacked in layers may be able to enhance the convergence ability of the laser beam, such that the location accuracy of the laser annealing may be improved, and the performance of the at least one gate output transistor may be enhanced.

In addition, the focal points of the respective microlens may be configured to be in the same focal plane, such that the laser beam irradiated on the amorphous silicon active layer may have an improved intensity uniformity, and the crystallized polysilicon active layer may have an improved uniformity, accordingly.

In the disclosed embodiments, the electron mobility of the gate output active layer MG2 may be configured to be much larger than the electron mobility of the display active layer 12. In one embodiment, referring to FIGS. 2 and 4, the electron mobility of the gate output active layer MG2 is P1, and the electron mobility of the display active layer 12 is P2, where P1/P210. That is, the value of P1 is at least ten the value of P2. Thus, compared to the existing array substrate, in the disclosed array substrate, the area occupied by the at least one gate output transistor MG may be further reduced and, accordingly, the area occupied by the gate driving circuit in the non-display area may be further reduced, which is favorable for realizing a narrow bezel design.

In practical applications, the electron mobility P1 of the gate output active layer MG2 and the electron mobility P2 of the display active layer 12 may be determined according to various applications. In one embodiment, the electron mobility P1 of the gate output active layer MG2 and the electron mobility P2 of the display active layer 12 may be respectively configured to be, 10 cm²/(volt·sec)≤P1≤100 cm²/(volt·sec), and 0.2 cm²/(volt·sec)≤P2≤1.5 cm²/(volt·sec). Because the electron mobility of polysilicon is much larger than the electron mobility of amorphous silicon, given the same ON-state current $I_{on}$ and the same OFF-state current $I_{off}$, the area occupied by the polysilicon transistor (i.e., the gate output transistor MG) may be smaller than the area occupied by the amorphous silicon transistor (i.e., the display transistor). In the disclosed embodiment, the area occupied by the at least one gate output transistor MG may be substantially small, which may facilitate the narrow bezel design.

In one embodiment, referring to FIG. 2, FIG. 3 and FIG. 4, the plurality of stages of shift registers 31 may be arranged in a first direction Y, and the at least one gate output transistors MG of the plurality of stages of shift registers 31 may be arranged in the first direction Y. In the fabrication process of the disclosed array substrate, because the at least one gate output transistors MG in the plurality of stages of shift registers 31 are arranged in the first direction Y, when the gate output active layers of the at least one gate output transistors MG are irradiated with the laser beam, the laser beam may only be configured to move in the first direction Y relative to the array substrate. Thus, the fabrication process of the disclosed array substrate may be simplified, and the production efficiency may be improved.

In one embodiment, referring to FIG. 2, FIG. 3 and FIG. 4, in the plurality of shift register transistors 40, except the at least one gate output transistors MG, the active layers of all the other shift register transistors may include a material of amorphous silicon. In the disclosed array substrate, in one shift register, the material of the active layer of the at least one gate output transistor MG may be polysilicon, and the materials of the active layers of the remaining shift register transistors may include amorphous silicon. Thus, on one hand, the area occupied by the at least one gate output transistor MG may be reduced, thereby facilitating the narrow bezel design. On the other hand, the OFF-state current $I_{off}$ of the remaining shift register transistors may be configured to be substantially small, thereby suppressing the leakage current in the remaining shift register transistors, and preventing the normal operation of the array substrate from being affected by the leakage current.

It is understood that the OFF-state current $I_{off}$ of the shift register transistor increases with the temperature. However, in the disclosed array substrate, the OFF-state current $I_{off}$ of the remaining shift register transistors may remain substantially small in a high temperature environment, which may maintain the normal operation of the array substrate in the high temperature environment.

Figure 7:
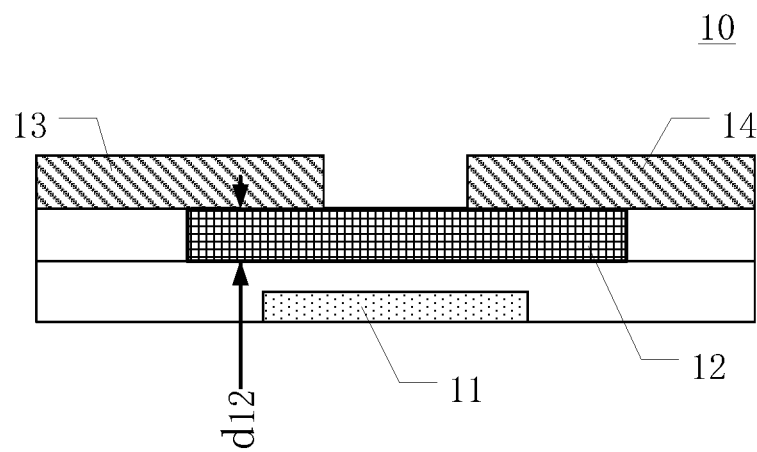
FIG. 7 illustrates a cross-sectional view of an exemplary display transistor in FIG. 3 consistent with disclosed embodiments.
Figure 8:
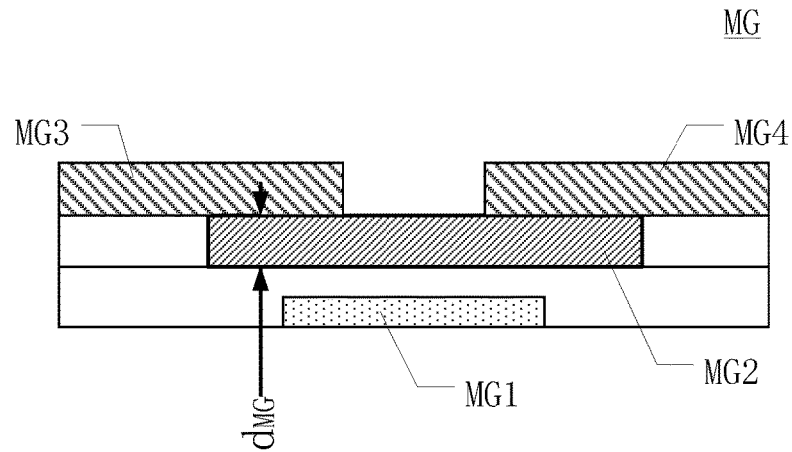
FIG. 8 illustrates a cross-sectional view of an exemplary gate output transistor in FIG. 4 consistent with disclosed embodiments.

In another embodiment, referring to FIG. 7 and FIG. 8, in which FIG. 7 illustrates a cross-sectional view of an exemplary display transistor in FIG. 3 consistent with disclosed embodiments and FIG. 8 illustrates a cross-sectional view of an exemplary gate output transistor in FIG. 4 consistent with disclosed embodiments, the thickness $d_{MG}$ of the gate output active layer MG2 may be configured to be smaller than the thickness $d_{12}$ of the display active layer 12.

Because the material of the gate output active layer MG2 includes polysilicon and the material of the display active layer 12 includes amorphous silicon, the electron mobility of the gate output active layer MG2 may be significantly greater than the electron mobility of the display active layer 12. Thus, the switching characteristics of the gate output active layer MG2 may be superior to the switching characteristics of the display transistor 12. Therefore, the at least one gate output transistor MG may be fabricated to be substantially small and thin, thereby reducing the area and the volume of the non-display area BB, and facilitating the narrow bezel design. Thus, the thickness $d_{MG}$ of the gate output active layer MG2 may be configured to be smaller than the thickness $d_{12}$ of the display active layer 12.

In practical applications, the thickness $d_{MG}$ of the gate output active layer MG2 and the thickness $d_{12}$ of the display active layer 12 may be determined according to various application scenarios, which is not limited by the present disclosure.

In one embodiment, the thickness $d_{MG}$ of the gate output active layer MG2 may be less than or equal to approximately 3500 Å. In particular, because the gate output active layer MG2 is made of polysilicon while the display active layer 12 is made of amorphous silicon, the electron mobility of the gate output active layer MG2 is higher than the electron mobility of the display active layer 12. That is, the gate output active layer MG2 may have a stronger electron transport capability than the display active layer 12, such that the equivalent resistance of the gate output active layer MG2 may be smaller than the equivalent resistance of the display active layer 12. Thus, even the thickness of the gate output active layer MG2 is reduced, the electron transport capability of the gate output active layer MG2 may substantially remain strong.

For example, when the electron mobility of the gate output active layer MG2 is ten times the electron mobility of the display active layer 12, the thickness of the gate output active layer MG2 may be configured to be half of the thickness of the display active layer 12, however, the electron transport capability of the gate output active layer MG2 may be still much stronger than the electron transport capability of the display active layer 12. Thus, the gate output active layer MG2 may be reduced according to various application scenarios. For example, in certain embodiments, the thickness of the source layer MG2 may be may be configured to be half or one-third of the thickness of the display active layer 12, which is for illustrative purposes and is not intended to limit the scope of the present disclosure.

It should be noted that, in the disclosed embodiments, the thickness $d_{MG}$ of the gate output active layer MG2 refers to the length of the gate output active layer MG2 in the direction perpendicular to the array substrate, and the thickness $d_{12}$ of the display active layer 12 refers to the length of the display active layer 12 in the direction perpendicular to the array substrate. In one embodiment, when the thickness $d_{MG}$ of the gate output active layer MG2 is less than or equal to approximately 3500 Å, the gate output transistor MG may still maintain a substantially good efficiency.

In one embodiment, in the array substrate, the gate output transistor MG may have a bottom-gate structure. It is understood that the basic structure of a TFT includes a gate electrode, an active layer, a source electrode and a drain electrode. According to the relative positions of the gate electrodes in the TFT, the TFTs can be divided into bottom-gate structure TFTs and top-gate structure TFTs.

In a bottom-gate structure TFT, the gate electrode is disposed on a side of the active layer facing away from the source electrode and the drain electrode. In the top-gate structure TFT, the active layer is disposed on a side of the gate electrode far away from the source electrode and the drain electrode. In the disclosed array substrates, the one gate output transistor may be configured as either the bottom-gate structure TFT or top-gate structure TFT.

In the bottom-gate structure TFT, the source electrode and the drain electrode are close to the active layer, and the source electrode and the drain electrode are electrically connected to the active layer without passing through the via holes/through-holes. In the top-gate structure TFT, because the gate electrode is sandwiched between the source/drain electrode and the active layer, the source electrode and the drain electrode have to be electrically connected to the active layer through the via holes/through-holes. In one embodiment, as shown in FIG. 8, the gate output transistor may be a bottom gate structure TFT, simplifying the structure of the gate output transistor.

In one embodiment, the plurality of stages of shift registers may comprise a first stage shift register to an N-th stage shift register, where N is an integer, and N≥3. The plurality of shift register transistors in each shift register may include at least one charging transistor and at least one first output transistor, and the at least one charging transistor may be configured to charge the at least one bootstrap point.

In particular, the at least one first output transistor of the X-th stage shift register may have the gate electrode electrically connected to the at least one bootstrap point of the X-th stage shift register, and a first electrode electrically connected to the gate electrode of the least one charging transistor of the (X+1)-th stage shift register, where 1≤X≤N−1. The at least one first output transistor may not output a scanning signal to the gate line. The at least one first output transistor may also include a first active layer, and a material of the first active layer may include amorphous silicon.

In the disclosed array substrate, because the first electrode of the at least one first output transistor of the X-th stage shift register is electrically connected to the gate electrode of the least one charging transistor of the (X+1)-th stage shift register, the OFF-state current $I_{off}$ of the at least one first output transistor the X-th stage shift register may affect the voltage at the gate electrode of the least one charging transistor of the (X+1)-th stage shift register. Because the voltage at the gate electrode of the least one charging transistor of the (X+1)-th stage shift register controls the turn-on and turn-off of the least one charging transistor of the (X+1)-th stage shift register, the charging of the at least one bootstrap point of the (X+1)-th stage shift register may be controlled.

Thus, through configuring the material of the first active layer of the at least one first output transistor to include amorphous silicon, the OFF-current $I_{off}$ of the at least one first output transistor may be substantially small. That is, the leakage current of the at least one first output transistor may be substantially small, such that the influence of the at least one first output transistor of the X-th stage shift register on the at least one bootstrap point of the (X+1)-th stage shift register may be reduced, thereby ensuring the normal operation of the (X+1)-th stage shift register.

It is understood that the OFF-state current $I_{off}$ of the shift register transistor increases with the temperature. However, in the disclosed array substrate, the OFF-state current $I_{off}$ of the at least one first output transistor may remain substantially small in a high temperature environment, which may maintain the normal operation of the array substrate in the high temperature environment.

Figure 9:
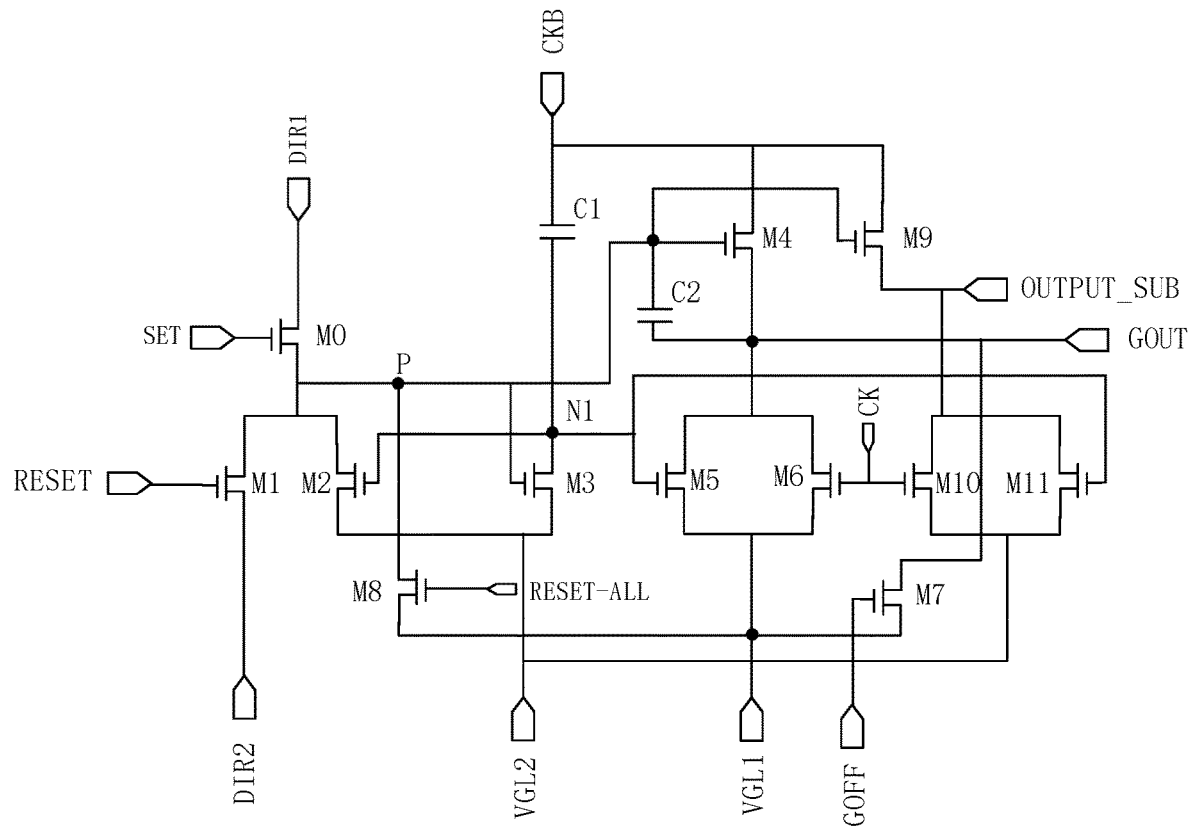
FIG. 9 illustrates a circuit diagram of an exemplary shift register in an exemplary array substrate consistent with disclosed embodiments.

FIG. 9 illustrates a circuit diagram of an exemplary shift register in an exemplary array substrate consistent with disclosed embodiments.

As shown in FIG. 9, the shift register may include a zeroth transistor M0, a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a first capacitor C1 and a second capacitor C2, A gate electrode of the zeroth transistor M0 may be electrically connected to a start signal input terminal SET, a first electrode of the zeroth transistor M0 may be electrically connected to a first voltage signal input terminal DIR1, and a second electrode of the zeroth transistor M0 may be electrically connected to a bootstrap point P.

A gate electrode of the first transistor M1 may be electrically connected to a first reset signal input terminal RESET, a first electrode of the first transistor M1 may be electrically connected to the bootstrap point P, and a second electrode of the first transistor M1 may be electrically connected to a second voltage signal input terminal DIR2.

A gate electrode of the second transistor M2 may be electrically connected to a first node N1, a first electrode of the second transistor M2 may be electrically connected to the bootstrap point P, and a second electrode of the second transistor M2 may be electrically connected to a third voltage signal input VGL2.

A gate electrode of the third transistor M3 may be electrically connected to the bootstrap point P, a first electrode of the third transistor M3 may be electrically connected to the first node N1, and a second electrode of the third transistor M3 may be electrically connected to the third voltage signal input terminal VGL2.

A gate electrode of the fourth transistor M4 may be electrically connected to the bootstrap point P, a first electrode of the fourth transistor M4 may be electrically connected to a first clock signal input terminal CKB, and a second electrode of the fourth transistor M4 may be electrically connected to a first signal output terminal GOUT.

A gate electrode of the fifth transistor M5 may be electrically connected to the first node N1, a first electrode of the fifth transistor M5 may be electrically connected to the first signal output terminal GOUT, and a second electrode of the fifth transistor M5 may be electrically connected to a fourth voltage signal input terminal VGL1.

A gate electrode of the sixth transistor M6 may be electrically connected to a second clock signal input terminal CK, a first electrode of the sixth transistor M6 may be electrically connected to the first signal output terminal GOUT, and a second electrode of the sixth transistor M6 may be electrically connected to a fourth voltage signal input terminal VGL1.

A gate electrode of the seventh transistor M7 may be electrically connected to a fifth voltage signal input terminal GOFF, a first electrode of the seventh transistor M7 may be electrically connected to the first signal output terminal GOUT, and a second electrode of the seventh transistor M7 may be electrically connected to a fourth voltage signal input terminal VGL1.

A gate electrode of the eighth transistor M8 may be electrically connected to a second reset signal input RESET-ALL, a first electrode of the eighth transistor M8 may be electrically connected to the bootstrap point P, and a second electrode of the eighth transistor M8 may be electrically connected to a fourth voltage signal input terminal VGL1.

A gate electrode of the ninth transistor M9 may be electrically connected to the bootstrap point P, a first electrode of the ninth transistor M9 may be electrically connected to the first clock signal input terminal CKB, and a second electrode of the ninth transistor M9 may be electrically connected to a second signal output terminal OUTPUT_SUB.

A gate electrode of the tenth transistor M10 may be electrically connected to the second clock signal input terminal CK, a first electrode of the tenth transistor M10 may be electrically connected to the second signal output terminal OUTPUT_SUB, and a second electrode of the tenth transistor M10 may be electrically connected to the third voltage signal input terminal VGL2.

A gate electrode of the eleventh transistor M11 may be electrically connected to the first node N1, a first electrode of the eleventh transistor M11 may be electrically connected to the second signal output OUTPUT_SUB, and a second electrode of the eleventh transistor M11 may be electrically connected to the third voltage signal input terminal VGL2.

A first plate of the first capacitor C1 may be electrically connected to the first clock signal input terminal CKB, and a second plate of the first capacitor C1 may be electrically connected to the first node N1.

A first plate of the second capacitor C2 may be electrically connected to the bootstrap point P, and a second plate of the second capacitor C2 may be electrically connected to the first signal output terminal GOUT.

The at least one gate output transistor may include the fourth transistor M4, and the at least one first output transistor may include the ninth transistor M9.

In the disclosed embodiments, in each of the plurality of stages shift registers in the gate driving circuit, the fourth transistor M4 may be configured as the at least one gate output transistor, and the material of the active layer of the fourth transistor M4 may include polysilicon. The ninth transistor M9 may be configured as the at least one first output transistor, and the material of the active layer of the ninth transistor M9 may include amorphous silicon. The first signal output terminal GOUT may be configured as the gate signal output terminal, i.e., the gate driving circuit may be electrically connected to the corresponding gate line through the first signal output terminal GOUT. The zeroth transistor M0 and the first transistor M1 may be configured as the at least one charging transistor.

It should be noted that in FIG. 9, the traces are electrically connected at the intersection of the "T" shapes, and the traces are all electrically connected at the black dots at the intersections of the "+" shapes.

In the disclosed embodiments, the plurality of stages of shift registers may be electrically connected in various ways, which may be determined according to various applications and is not limited by the present discourse.

Compared with the existing array substrate, the disclosed array substrate may be able to reduce the area occupied by the fourth transistor M4 configured as the at least one gate output transistor, thereby reducing the area occupied by the shift register in the non-display area BB. Moreover, the OFF-state current $I_{off}$ of the ninth transistor M9, which is configured as the at least one first output transistor, may be substantially small, i.e., the leakage current of the ninth transistor M9 may be substantially small. Thus, the influence of the ninth transistor M9 of the X-th stage shift register on the at least one bootstrap point of the (X+1)-th stage shift register may be reduced, and the normal operation of the (X+1)-th stage shift register may be ensured, accordingly.

It is understood that the OFF-state current $I_{off}$ of the shift register transistor increases with the temperature. However, in the disclosed array substrate, the OFF-state current $I_{off}$ of the ninth transistor M9, which is configured as the at least one first output transistor, may remain substantially small in a high temperature environment, which may maintain the normal operation of the array substrate in the high temperature environment.

In one embodiment, in the array substrate shown in FIG. 9, except the fourth transistor M4 and the ninth transistor M9, the material of the active layer of all the remaining shift register transistors (M0-M3, M5-M8 and M11) may be amorphous silicon.

Figure 10:
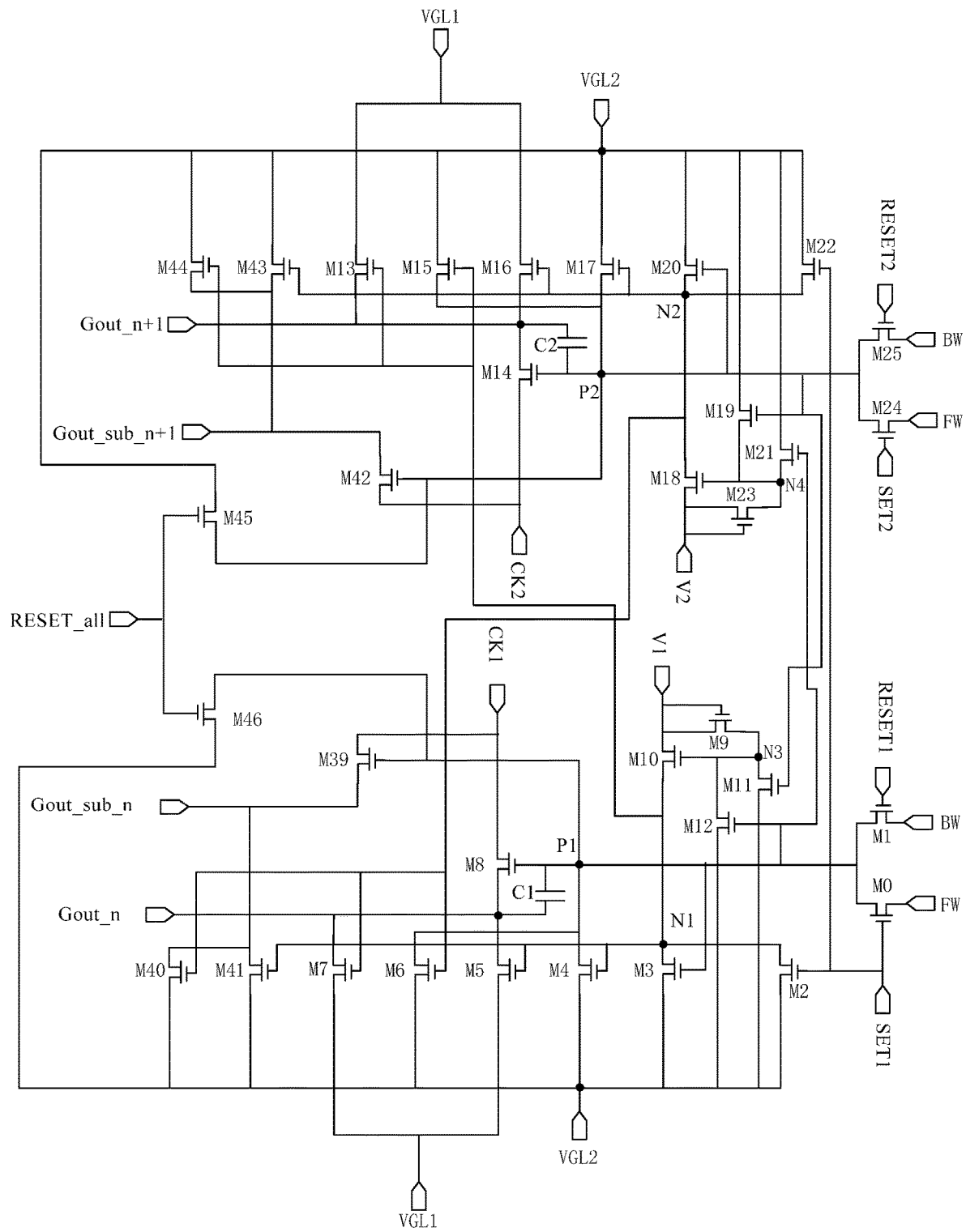
FIG. 10 illustrates a circuit diagram of another exemplary shift register in an exemplary array substrate consistent with disclosed embodiments.

FIG. 10 illustrates a circuit diagram of another exemplary shift register in an exemplary array substrate consistent with disclosed embodiments. As shown in FIG. 10, the shift register may include a zeroth transistor M0, a first transistor M1 to a twenty-fifth transistor M25, a thirty-ninth transistor M39 to a forty-sixth transistor M46, a first capacitor C1 and a second capacitor C2.

A gate electrode of the zeroth transistor M0 may be electrically connected to a first start signal input terminal SET1, a first electrode of the zeroth transistor M0 may be electrically connected to a first voltage signal FW, and a second electrode of the zeroth transistor M0 may be electrically connected to a first bootstrap point P1.

A gate electrode of the first transistor M1 may be electrically connected to a first reset signal input terminal RESET1, a first electrode of the first transistor M1 may be electrically connected to a second voltage signal BW, and a second electrode of the first transistor M1 may be electrically connected to the first bootstrap point P1.

A gate electrode of the second transistor M2 may be electrically connected to a first start signal input terminal SET1, a first electrode of the second transistor M2 may be electrically connected to a first node N1, and a second electrode of the second transistor M2 may be electrically connected to a second voltage signal input terminal VGL2.

A gate electrode of the third transistor M3 may be electrically connected to the first bootstrap point P1, a first electrode of the third transistor M3 may be electrically connected to the first node N1, and a second electrode of the third transistor M3 may be electrically connected to the second voltage signal input terminal VGL2.

A gate electrode of the fourth transistor M4 may be electrically connected to the first node N1, a first electrode of the fourth transistor M4 may be electrically connected to the first bootstrap point P1, and a second electrode of the fourth transistor M4 may be electrically connected to the second voltage signal input terminal VGL2.

A gate electrode of the fifth transistor M5 may be electrically connected to the first node N1, a first electrode of the fifth transistor M5 may be electrically connected to a first signal output terminal Gout_n, and a second electrode of the fifth transistor M5 may be electrically connected to a first voltage signal input terminal VGL1.

A gate electrode of the sixth transistor M6 may be electrically connected to a second node N2, a first electrode of the sixth transistor M6 may be electrically connected to the first bootstrap point P1, and a second electrode of the sixth transistor M6 may be electrically connected to the second voltage signal input terminal VGL2.

A gate electrode of the seventh transistor M7 may be electrically connected to the second node N2, a first electrode of the seventh transistor M7 may be electrically connected to the first signal output terminal Gout_n, and a second electrode of the seventh transistor M7 may be electrically connected to the first voltage signal input terminal VGL1.

A gate electrode of the eighth transistor M8 may be electrically connected to the first bootstrap point P1, a first electrode of the eighth transistor M8 may be electrically connected to a first clock signal input terminal CK1, and a second electrode of the eighth transistor M8 may be electrically connected to the first signal output terminal Gout_n.

A gate electrode of the ninth transistor M9 may be electrically connected to a third voltage signal V1, a first electrode of the ninth transistor M9 may be electrically connected to a third node N3, and a second electrode of the ninth transistor M9 may be electrically connected to the third voltage signal V1.

A gate electrode of the tenth transistor M10 may be electrically connected to the third node N3, a first electrode of the tenth transistor M10 may be electrically connected to the third voltage signal V1, and a second electrode of the tenth transistor M10 may be electrically connected to the first node N1.

A gate electrode of the eleventh transistor M11 may be electrically connected to a second bootstrap point P2, a first electrode of the eleventh transistor M11 may be electrically connected to the third node N3, and a second electrode of the eleventh transistor M11 may be electrically connected to the second voltage signal terminal VGL2.

A gate electrode of the twelfth transistor M12 may be electrically connected to the first bootstrap point P1, a first electrode of the twelfth transistor M12 may be electrically connected to the third node N3, and a second electrode of the twelfth transistor M12 may be electrically connected to the second voltage signal terminal VGL2.

A gate electrode of the thirteenth transistor M13 may be electrically connected to the first node N1, a first electrode of the thirteenth transistor M13 may be electrically connected to the first voltage signal input terminal VGL1, and a second electrode of the thirteenth transistor M13 is coupled to a second signal output terminal Gout_n+1.

A gate electrode of the fourteenth transistor M14 may be electrically connected to the second bootstrap point P2, a first electrode of the fourteenth transistor M14 may be electrically connected to the second signal output terminal Gout_n+1, and a second electrode of the fourteenth transistor M14 may be electrically connected to a second clock signal input terminal CK2.

A gate electrode of the fifteenth transistor M15 may be electrically connected to the first node N1, a first electrode of the fifteenth transistor M15 may be electrically connected to the second voltage signal input terminal VGL2, and a second electrode of the fifteenth transistor M15 may be electrically connected to the second bootstrap point P2;

A gate electrode of the sixteenth transistor M16 may be electrically connected to the second node N2, a first electrode of the sixteenth transistor M16 may be electrically connected to the first voltage signal input terminal VGL1, and a second electrode of the sixteenth transistor M16 may be electrically to the second signal output terminal Gout_n+1.

A gate electrode of the seventeenth transistor M17 may be electrically connected to the second node N2, a first electrode of the seventeenth transistor M17 may be electrically connected to the second voltage signal input terminal VGL2, and a second electrode of the seventeenth transistor M17 may be electrically connected to the second bootstrap point P2.

A gate electrode of the eighteenth transistor M18 may be electrically connected to the fourth node N4, a first electrode of the eighteenth transistor M18 may be electrically connected to the second node N2, and a second electrode of the eighteenth transistor M18 may be electrically connected to a fourth voltage signal V2.

A gate electrode of the nineteenth transistor M19 may be electrically connected to the second bootstrap point P2, a first electrode of the nineteenth transistor M19 may be electrically connected to the second voltage signal input terminal VGL2, and a second electrode of the nineteenth transistor M19 may be electrically connected to a fourth node N4.

A gate electrode of the twentieth transistor M20 may be electrically connected to the second bootstrap point P2, a first electrode of the twentieth transistor M20 may be electrically connected to the second voltage signal input terminal VGL2, and a second electrode of the twentieth transistor M20 may be electrically connected to the second node N2.

A gate electrode of the twenty-first transistor M21 may be electrically connected to the first bootstrap point P1, a first electrode of the twenty-first transistor M21 may be electrically connected to the second voltage signal input terminal VGL2, and a second electrode of the twenty-first transistor M21 may be electrically connected to the fourth node N4.

A gate electrode of the twenty-second transistor M22 may be electrically connected to the first start signal input terminal SET1, a first electrode of the twenty-second transistor M22 may be electrically connected to the second voltage signal input terminal VGL2, the second terminal of the twenty-second transistor M22 may be electrically connected to the second node N2.

A gate electrode of the twenty-third transistor M23 may be electrically connected to the fourth voltage signal V2, a first electrode of the twenty-third transistor M23 may be electrically connected to the fourth node N4, and a second electrode of the twenty-third transistor M23 may be electrically connected to the fourth voltage signal V2.

A gate electrode of the twenty-fourth transistor M24 may be electrically connected to a second start signal input SET2, a first electrode of the twenty-fourth transistor M24 may be electrically connected to a first voltage signal FW, and the second electrode of the twenty-fourth transistor M24 may be electrically connected to the second bootstrap point P2.

A gate electrode of the twenty-fifth transistor M25 may be electrically connected to a second reset signal input terminal RESET2, a first electrode of the twenty-fifth transistor M25 may be electrically connected to a second voltage signal BW, and a second electrode of the twenty-fifth transistor M25 may be electrically connected to the second bootstrap point P2.

A gate electrode of the thirty-ninth transistor M39 may be electrically connected to the first bootstrap point P1, a first electrode of the thirty-ninth transistor M39 may be electrically connected to the first clock signal input terminal CK1, and a second electrode of the thirty-ninth transistor M39 may be electrically connected to a third signal output terminal Gout_sub_n.

A gate electrode of the fortieth transistor M40 may be electrically connected to the second node N2, a first electrode of the fortieth transistor M40 may be electrically connected to the third signal output terminal Gout_sub_n, and a second electrode of the fortieth transistor M40 may be electrically connected to the second voltage signal input terminal VGL2.

A gate electrode of the forty-first transistor M41 may be electrically connected to the first node N1, a first electrode of the forty-first transistor M41 may be electrically connected to the third signal output terminal Gout_sub_n, and a second electrode of the forty-first transistor M41 may be electrically connected to the second voltage signal input terminal VGL2.

A gate electrode of the forty-second transistor M42 may be electrically connected to the second bootstrap point P2, a first electrode of the forty-second transistor M42 may be electrically connected to a fourth signal output terminal Gout_sub_n+1, and a second electrode of the forty-second transistor M42 may be electrically connected to the second clock signal input terminal CK2.

A gate electrode of the forty-third transistor M43 may be electrically connected to the second node N2, a first electrode of the forty-third transistor M43 may be electrically connected to the second voltage signal input terminal VGL2, and a second electrode of the forty-third transistor M43 may be electrically connected to the fourth signal output terminal Gout_sub_n+1.

A gate electrode of the forty-fourth transistor M44 may be electrically connected to the first node N1, a first electrode of the forty-fourth transistor M44 may be electrically connected to the second voltage signal input terminal VGL2, and a second electrode of the forty-fourth transistor M44 may be electrically connected to the fourth signal output terminal Gout_sub_n+1.

A gate electrode of the forty-fifth transistor M45 may be electrically connected to a third reset signal input terminal RESET_all, a first electrode of the forty-fifth transistor M45 may be electrically connected to the second voltage signal input terminal VGL2, and a second electrode of the forty-fifth transistor M45 may be electrically connected to the second bootstrap point P2.

A gate electrode of the forty-sixth transistor M46 may be electrically connected to the third reset signal input terminal RESET_all, a first electrode of the forty-sixth transistor M46 may be electrically connected to the first bootstrap point P1, and a second electrode of the forty-sixth transistor M46 may be electrically connected to the second voltage signal input terminal VGL2.

A first plate of the first capacitor C1 may be electrically connected to the first bootstrap point P1, and a second plate of the first capacitor C1 may be electrically connected to the first signal output terminal Gout_n.

A first plate of the second capacitor C2 may be electrically connected to the second bootstrap point P2, and the second plate of the second capacitor C2 may be electrically connected to the second signal output Gout_n+1.

The at least one gate output transistor may include the eighth transistor M8 and the fourteenth transistor M14. The at least one first output transistor may include the thirty-ninth transistor M39 and the forty-second transistor M42. In particular, the at least one bootstrap point may include the first bootstrap point P1 and the second bootstrap point P2.

It should be noted that, in FIG. 10, the traces are electrically connected at the intersection of the "T" shapes, and the traces are all electrically connected at the black dots at the intersections of the "Z" patterns.

In the disclosed embodiments, the plurality of stages of shift registers may be electrically connected in various ways, which may be determined according to various applications and is not limited by the present discourse.

In the array substrate shown in FIG. 10, the eighth transistor M8 and the fourteenth transistor M14 each may be configured as the at least one gate output transistor, and the material of the active layer of the eighth transistor M8 and the fourteenth transistor M14 each may include polysilicon. Compared with the existing array substrate, the area occupied by the eighth transistor M8 and the fourteenth transistor M14 may be reduced, such that the area occupied by the shift register in the non-display area may be reduced, accordingly.

Meanwhile, the thirty-ninth transistor M39 and the forty-second transistor M42 each may be configured as the at least one first output transistor, the material of the active layer of the thirty-ninth transistor M39 and the forty-second transistor M42 each may include amorphous silicon.

The OFF-state current $I_{off}$ of the thirty-ninth transistor M39 and the forty-second transistor M42 may be substantially small, i.e., the leakage current of the thirty-ninth transistor M39 and the forty-second transistor M42 may be substantially small, such that the influence of the thirty-ninth transistor M39 and the forty-second transistor M42 in the X-th stage shift register on the at least one bootstrap point of the (X+1)-th stage shift register may be reduced, and the normal operation of the (X+1)-th stage shift register may be ensured, accordingly.

The first signal output terminal Gout_n and the second signal output terminal Gout_n+1 both may be gate signal output terminals. That is, the gate driving circuit may be electrically connected to the n-th gate line through the first signal output terminal Gout_n, and the gate driving circuit may be electrically connected to the (n+1)-th gate line through the second signal output terminal Gout_n+1.

The zeroth transistor M0 and the first transistor M may be the charging transistors, and the zeroth transistor M0 and the first transistor M may be charged by the first bootstrap point P1. The twenty-fourth transistor M24 and the twenty-fifth transistor M25 both may be charging transistors, and the twenty-fourth transistor M24 and the twenty-fifth transistor M25 may be charged by the second bootstrap point P2.

In one embodiment, as shown in FIG. 10, except the eighth transistor M8, the fourteenth transistor M14, the thirty-ninth transistor M39 and the forty-second transistor M42, the active layers of all the remaining shift register transistors may include a material of amorphous silicon.

In one embodiment, the plurality of shift register transistors may include at least one charging transistor for charging the bootstrap point P. The least one charging transistor may include a charging active layer, and the material of the charging active layer may include amorphous silicon. Because the material of the charging active layer of the least one charging transistor includes amorphous silicon, the OFF-state current $I_{off}$ of the least one charging transistor may be substantially small.

It is understood that the OFF-state current $I_{off}$ of the shift register transistor increases with the temperature. However, in the disclosed array substrate, the OFF-state current $I_{off}$ of the least one charging transistor may remain substantially small in a high temperature environment, which may maintain the normal operation of the array substrate in the high temperature environment.

Figure 11:
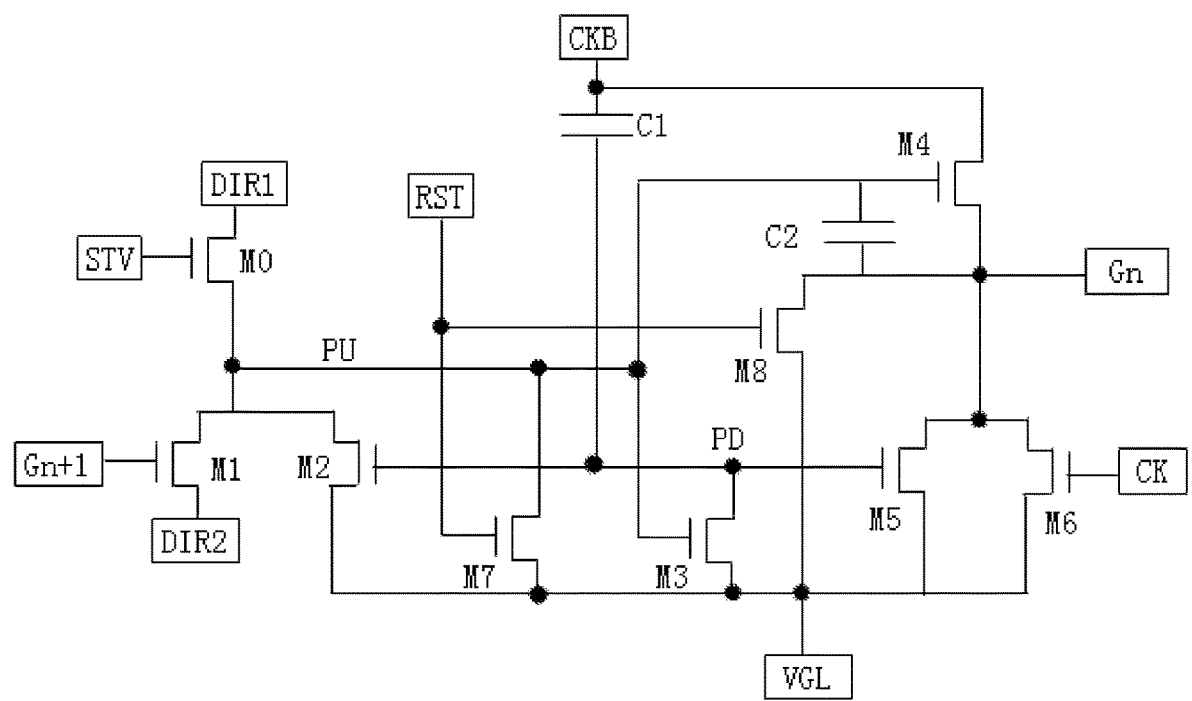
FIG. 11 illustrates a circuit diagram of another exemplary shift register in an exemplary array substrate consistent with disclosed embodiments.

FIG. 11 illustrates a circuit diagram of another exemplary shift register in an exemplary array substrate consistent with disclosed embodiments. As shown in FIG. 11, the shift register may include a zeroth transistor M0, a first transistor M1, a second transistor M2, a third transistor M3, a fourth transistor M4, a fifth transistor M5, a sixth transistor M6, a seventh transistor M7, an eighth transistor M8, a first capacitor C1 and a second capacitor C2.

A gate electrode of the zeroth transistor M0 may be electrically connected to a start signal input terminal STV, a first electrode of the zeroth transistor M0 may be electrically connected to a first voltage signal input terminal DIR1, and a second electrode of the zeroth transistor M0 may be electrically connected to a bootstrap point P.

A gate electrode of the first transistor M1 may be electrically connected to a first voltage signal input terminal Gn+1, a first electrode of the first transistor M1 may be electrically connected to the bootstrap point P, and a second electrode of the first transistor M1 may be electrically to a second voltage signal input terminal DIR2.

A gate electrode of the second transistor M2 may be electrically connected to the first node N1, the first electrode of the second transistor M2 may be electrically connected to the bootstrap point P, and a second electrode of the second transistor M2 may be electrically connected to a second voltage signal input terminal VGL.

A gate electrode of the third transistor M3 may be electrically connected to the bootstrap point P, a first electrode of the third transistor M3 may be electrically connected to a first node N1, and a second electrode of the third transistor M3 may be electrically connected to the second voltage signal input terminal VGL.

A gate electrode of the fourth transistor M4 may be electrically connected to the bootstrap point P, a first electrode of the fourth transistor M4 may be electrically connected to a first clock signal input terminal CKB, and a second electrode of the fourth transistor M4 may be electrically connected to a first signal output terminal Gn A gate electrode of the fifth transistor M5 may be electrically connected to the first node N1, a first electrode of the fifth transistor M5 may be electrically connected to the first signal output terminal Gn, and a second electrode of the fifth transistor M5 may be electrically connected to the second voltage signal input terminal VGL.

A gate electrode of the sixth transistor M6 may be electrically connected to a second clock signal input terminal CK, a first electrode of the sixth transistor M6 may be electrically connected to the first signal output terminal Gn, and a second electrode of the sixth transistor M6 may be electrically connected to the second voltage signal input terminal VGL.

A gate electrode of the seventh transistor M7 may be electrically connected to a first reset signal input terminal RESET, a first electrode of the seventh transistor M7 may be electrically connected to the bootstrap point P, and a second electrode of the seventh transistor M7 may be electrically connected to the second voltage signal input terminal VGL.

A gate electrode of the eighth transistor M8 may be electrically connected to the first reset signal input terminal RESET, a first electrode of the eighth transistor M8 may be electrically connected to the first signal output terminal Gn, and a second electrode of the eighth transistor M8 may be electrically connected to the second voltage signal input terminal VGL.

A first plate of the first capacitor C1 may be electrically connected to the first clock signal input terminal CKB, and a second plate of the first capacitor C1 may be electrically connected to the first node N1.

A first plate of the second capacitor C2 may be electrically connected to the bootstrap point P, and a second plate of the second capacitor C2 may be electrically connected to the first signal output terminal Gn.

The least one charging transistor may include the zeroth transistor M0 and the first transistor M1, and the at least one gate output transistor may include the fourth transistor M4.

It should be noted that, in FIG. 11, the traces are electrically connected at the intersection of the "T" shapes, and the traces are all electrically connected at the black dots at intersections of the "+" shapes.

In the disclosed array substrate, the fourth transistor M4 may be the at least one gate output transistor, and the material of the active layer of the fourth transistor M4 may include polysilicon. Compared with the existing array substrate, the area occupied by the fourth transistor M4 may be reduced, such that the area occupied by the shift register in the non-display area may be reduced.

The zeroth transistor M0 and the first transistor M1 may be the least one charging transistor. The material of the active layer of the zeroth transistor M0 and the first transistor M1 may include amorphous silicon, and the OFF-state current $I_{off}$ of the zeroth transistor M0 and the first transistor M1 may be substantially small. Even in a high temperature environment, the OFF-state current $I_{off}$ of the remaining shift register transistors may remain substantially small, which may maintain the normal operation of the array substrate in the high temperature environment.

The first signal output terminal Gn may be the gate signal output terminal, i.e., the gate driving circuit may be electrically connected to the corresponding gate line through the first signal output terminal Gn.

In one embodiment, as shown in FIG. 11, except the zeroth transistor M0 and the first transistor M1, the material of the active layer of all the remaining shift register transistors may be amorphous silicon.

In certain embodiments, the gate driving circuit may have a forward scan function, and the plurality of stages of shift registers may include a first stage shift register to an N-th stage shift register, where N is an integer and N≥3. The shift register may include a gate signal output terminal, and the plurality of shift register transistors in the shift register may include a first charging transistor and a second charging transistor for charging the bootstrap point P. The gate electrode of the first charging transistor in the X-th stage shift register may be electrically connected to the gate signal output terminal of the (X−1)-th stage shift register. The gate electrode of the second charging transistor of the X-th stage of shift register may be electrically connected to the gate signal output terminal of the (X+1)-th stage shift register, where $2 \leq X \leq N-1$.

Further, the first charging transistor may include a first charging active layer, and the material of the first charging active layer may include amorphous silicon. The second charging transistor may include a second charging active layer, and the material of the second charging active layer may include polysilicon. The gate driving circuit may be configured to have a forward scanning function or a forward-backward scanning function. The forward scanning function refers to that, from the first-stage shift register to the N-th stage shift register the first-stage shift register to the N-th stage shift register sequentially output a gate signal to a corresponding gate line. The forward-backward scanning function refers to that the gate drive circuit has both the forward and backward scanning function, and the backward scanning function refers to that, from the N-th stage shift register to the first stage shift register, the N-th stage shift register to the first shift register sequentially output a gate signal to a corresponding gate line.

In the disclosed embodiment, the electrical connection between the plurality of stages of shift registers may be determined according to various application scenarios, which is not limited by the present disclosure.

In one embodiment, the gate driving circuit may have the forward scanning function. The material of the first charging active layer of the first charging transistor may include amorphous silicon, and the material of the second charging active layer of the second charging transistor may include polysilicon. In the forward scanning, the gate electrode of the first charging transistor may serve as a start signal input for inputting a valid pulse signal.

On one hand, the material of the first charging active layer of the first charging transistor may include amorphous silicon and, thus, the OFF-current $I_{off}$ of the first charging transistor may be substantially small. Accordingly, the influence of the OFF-current $I_{off}$ of the first charging transistor on the bootstrap point P may be reduced, and the normal operation of the array substrate may be ensured. On the other hand, the material of the second charging active layer of the second charging transistor may include polysilicon, such that the area occupied by the second charging transistor may be reduced, and the narrow bezel design may be achieved.

In another embodiment, the gate driving circuit may have the forward-backward scanning function. The electrical connections of the plurality of cascaded shift registers may be referred to FIG. 12. Except the first stage shift register G1 and the N-th stage shift register GN, the signal output terminals OUT of the X-th stage shift register may input a first control signal to a first control terminal S1 of the (X+1)-th stage shift register and, meanwhile, input a second control signal to a second control terminal S2 of the (X−1)-th stage shift register, where 2≤X≤N−1.

The signal output terminal OUT of the N-th stage shift register GN may input the first control signal to the first control terminal S1 of the first stage shift register G1. The signal output terminal OUT of the first stage shift register G1 may input the second control signal to the second control terminal S2 of the N-th stage shift register GN.

Figure 12:
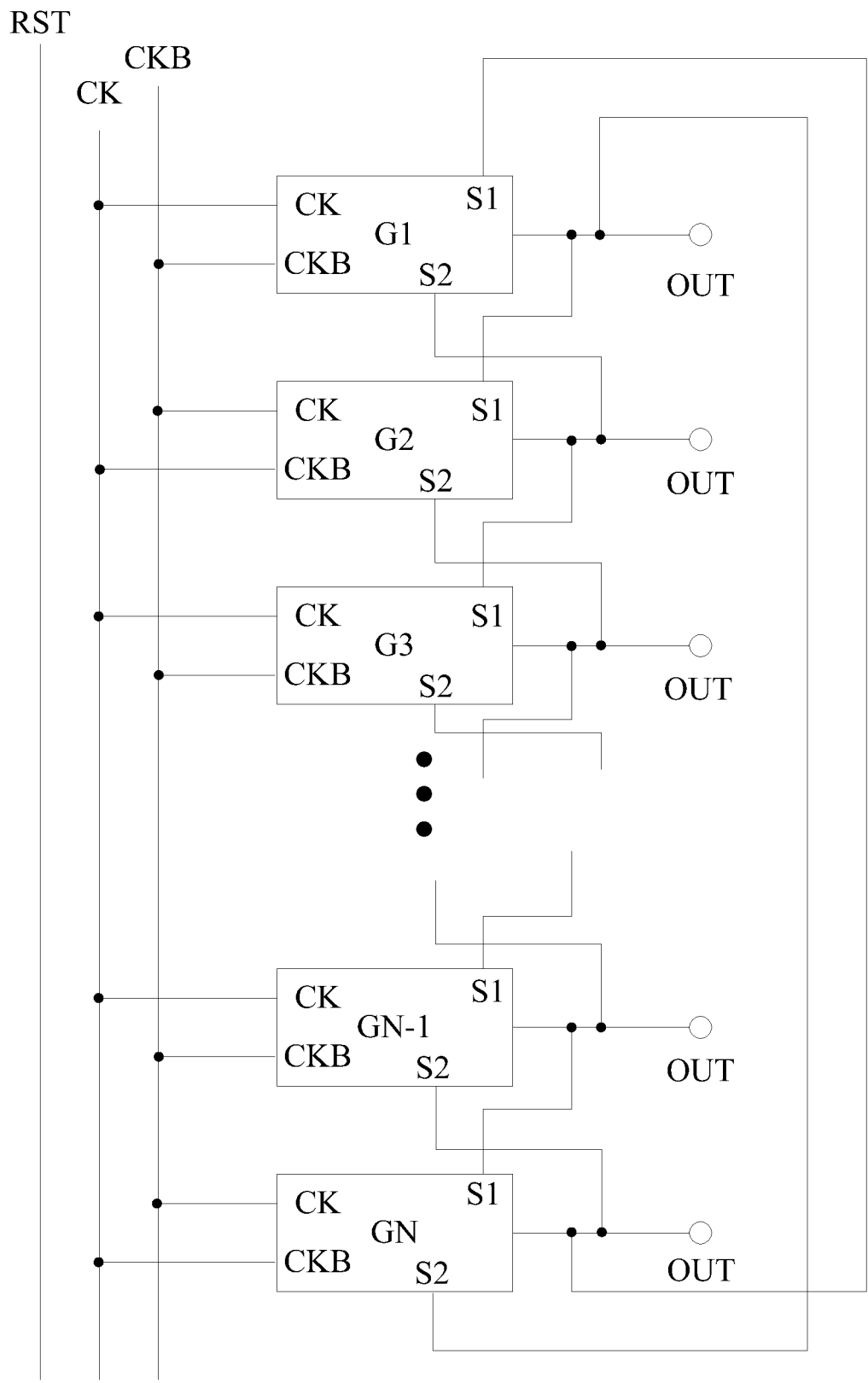
FIG. 12 illustrates an exemplary electrical connection of a plurality of stages of exemplary shift registers consistent with disclosed embodiments.

In each of the first stage shift register G1 to the N-th stage shift register GN in FIG. 12, the signal output terminal OUT may correspond to the first signal output terminal Gn in FIG. 11, the first control terminal S1 in FIG. 12 may correspond to the gate electrode of the first charging transistor in FIG. 11, and the second control terminal S2 in FIG. 12 may correspond to the gate electrode of the second charging transistor in FIG. 11.

In one embodiment, during the forward scanning, the gate electrode of the first charging transistor may be configured as the signal input terminal for inputting a valid pulse signal, and the gate electrode of the second charging transistor may be configured as the reset signal terminal for inputting a reset signal.

In another embodiment, during the backward scanning, the gate electrode of the first charging transistor may be configured as the reset signal terminal for inputting a reset signal, and the gate electrode of the second charging transistor may be configured as the signal input terminal for inputting a valid pulse signal.

When the gate driving circuit has the forward-backward scanning function, the first charging transistor may include the first charging active layer comprising amorphous silicon, and the second charging transistor may include the second charging active layer comprising amorphous silicon. Thus, the OFF-state current $I_{off}$ of the first charging transistor and the second charging transistor may be substantially small. Accordingly, the influence of the OFF-state current $I_{off}$ of the first charging transistor and the second charging transistor on the bootstrap point P may be reduced, and the normal operation of the array substrate may be ensured.

Further, as shown in FIG. 11, the shift register may include a zeroth transistor M0, a first transistor M1, a second transistor M2, a third transistor M3, a fourth transistor M4, a fifth transistor M5, a sixth transistor M6, a seventh transistor M7, an eighth transistor M8, a first capacitor C1 and a second capacitor C2.

A gate electrode of the zeroth transistor M0 may be electrically connected to a start signal input terminal STV, a first electrode of the n zeroth transistor M0 may be electrically connected to a first voltage signal input terminal DIR1, and a second electrode of the zeroth transistor M0 may be electrically connected to a bootstrap point PU.

A gate electrode of the first transistor M1 may be electrically connected to a first voltage signal input terminal Gn+1, a first electrode of the first transistor M1 may be electrically connected to the bootstrap point PU, and a second electrode of the first transistor M1 may be electrically to a second voltage signal input terminal DIR2.

A gate electrode of the second transistor M2 may be electrically connected to a first node PD, a first electrode of the second transistor M2 may be electrically connected to the bootstrap point PU, and a second electrode of the second transistor M2 may be electrically connected to the second voltage signal input terminal VGL.

A gate electrode of the third transistor M3 may be electrically connected to the bootstrap point PU, a first electrode of the third transistor M3 may be electrically connected to the first node PD, and a second electrode of the third transistor M3 may be electrically connected to the second voltage signal input terminal VGL.

A gate electrode of the fourth transistor M4 may be electrically connected to the bootstrap point PU, a first electrode of the fourth transistor M4 may be electrically connected to a first clock signal input terminal CKB, and a second electrode of the fourth transistor M4 may be electrically connected to a first signal output terminal Gn.

A gate electrode of the fifth transistor M5 may be electrically connected to the first node PD, a first electrode of the fifth transistor M5 may be electrically connected to the first signal output terminal Gn, and a second electrode of the fifth transistor M5 may be electrically connected to the second voltage signal input terminal VGL.

A gate electrode of the sixth transistor M6 may be electrically connected to a second clock signal input terminal CK, a first electrode of the sixth transistor M6 may be electrically connected to the first signal output terminal Gn, and a second electrode of the sixth transistor M6 may be electrically to the second voltage signal input terminal VGL.

A gate electrode of the seventh transistor M7 may be electrically connected to a first reset signal input terminal RESET, a first electrode of the seventh transistor M7 may be electrically connected to the bootstrap point PU, and a second electrode of the seventh transistor M7 may be electrically connected to the second voltage signal input terminal VGL.

A gate electrode of the eighth transistor M8 may be electrically connected to the first reset signal input terminal RESET, a first electrode of the eighth transistor M8 may be electrically connected to the first signal output terminal Gn, and a second electrode of the eighth transistor M8 is coupled to the second voltage signal input terminal VGL.

A first plate of the first capacitor C1 may be electrically connected to the first clock signal input terminal CKB, and a second plate of the first capacitor C1 may be electrically connected to the first node PD.

A first plate of the second capacitor C2 may be electrically connected to the bootstrap point P, and a second plate of the second capacitor C2 may be electrically connected to the first signal output terminal Gn.

The first charging transistor may include the zeroth transistor M0, the second charging transistor may include the first transistor M1, and the at least one gate output transistor may include the fourth transistor M4.

The first signal output terminal Gn may be the gate signal output terminal, i.e., the gate driving circuit may be electrically connected to the corresponding gate line through the first signal output terminal Gn.

In the disclosed embodiments, the zeroth transistor M0 may be configured as the first charging transistor, the first transistor M1 may be configured as the second charging transistor, and the fourth transistor M4 may be configured as the at least one gate output transistor. Thus, The OFF-state current $I_{off}$ of the zeroth transistor M0 and the first transistor M1 may be substantially small. Accordingly, the influence of the OFF-state current $I_{off}$ of the zeroth transistor M0 and the first transistor M1 on the bootstrap point PU may be reduced, and the normal operation of the array substrate may be ensured.

The present disclosure also provides a display panel comprising any one of the disclosed array substrates.

Figure 13:
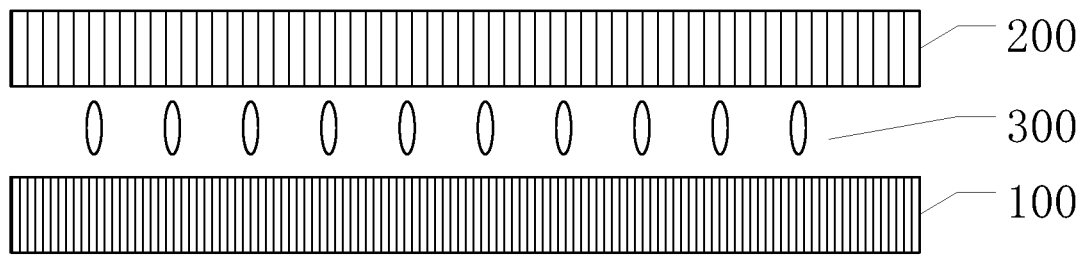
FIG. 13 illustrates a cross-sectional view of an exemplary display panel consistent with disclosed embodiments.

FIG. 13 illustrates a cross-sectional view of an exemplary display panel consistent with disclosed embodiments. As shown in FIG. 13, the display panel shown may include an array substrate 100 and an opposite substrate 200. The array substrate 100 may be any one of the disclosed array substrates.

In the disclosed embodiments, the display panel may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels, which is not limited by the present disclosure.

In one embodiment, as shown in FIG. 13, the display panel may be an LCD display panel, which may further include a liquid crystal layer 300 sandwiched between the array substrate 100 and the counter substrate 200. In certain embodiments, the opposite substrate 200 may be a glass cover or a color filter substrate, which is not limited by the present disclosure.

Figure 14:
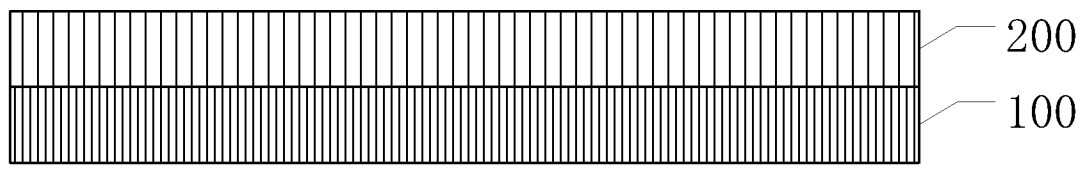
FIG. 14 illustrates a cross-sectional view of another exemplary display panel consistent with disclosed embodiments.

In another embodiment, the display panel provided may be an OLED display panel. FIG. 14 illustrates a cross-sectional view of another exemplary display panel consistent with disclosed embodiments. As shown in FIG. 14, the display panel may include an array substrate 100 and an opposite substrate 200. The array substrate 100 may be any one of the disclosed array substrates. In certain embodiments, the opposite substrate 200 may be a rigid glass substrate or a flexible package substrate, which is not limited by the present disclosure.

Because the display panel includes any one of the disclosed array substrates, the display panel may exhibit the same advantages as the array substrate, which are not repeated here.

The present disclosure further provides a display device, which may include any one of the disclosed display panels.

Figure 15:
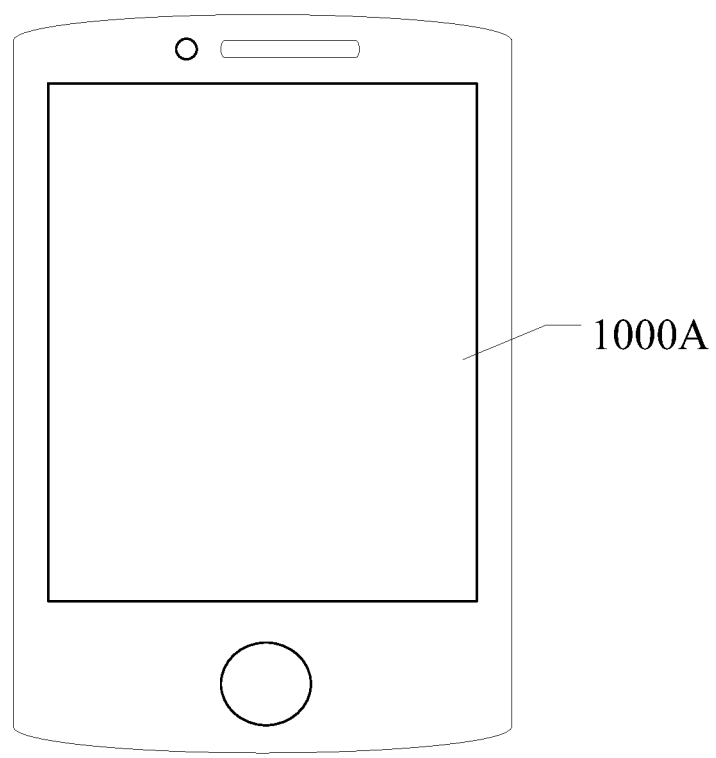
FIG. 15 illustrates a schematic diagram of an exemplary display device consistent with disclosed embodiments.

FIG. 15 illustrates a schematic diagram of an exemplary display device consistent with disclosed embodiments. As shown in FIG. 15, the display device 1000 may include a display panel 1000A, and the display panel 1000A may be any one of the disclosed display panels. The display device 1000 may be a cell phone including any of the disclosed display panel 1000A, as shown in FIG. 5. The display device 1000 may also be a TV, a smartphone, a notebook, and a smartwatch including any of the disclosed display panel 1000A, etc. Further, the display device 1000 may be any appropriate type of content-presentation devices including any of the disclosed display panel 1000A.

Because the display device includes any one of the disclosed display panels, the display device may exhibit the same advantages as the display panels, which are not repeated here.

In disclosed embodiments, the plurality of shift register transistors in each stage of the shift register may include at least one gate output transistor. The at least one gate output transistor may include a gate output active layer including a material of polysilicon. Because the electron mobility of polysilicon is larger than that the electron mobility of amorphous silicon, the at least one gate output transistor provided in the disclosed array substrate may have a substantially large ON-state current $I_{on}$, such that the charge and discharge of the at least one gate output transistor may be substantially fast.

Meanwhile, compared with the existing array substrate, the area of the gate output active layer may be reduced, such that the area occupied by the at least one gate output transistor may be reduced. Accordingly, the area occupied by the gate driving circuit in the non-display area may be reduced, which may facilitate the narrow bezel design.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An array substrate, comprising:
a display area including a plurality of display transistors and a plurality of gate lines, wherein a display transistor includes a display active layer comprising amorphous silicon; and
a non-display area surrounding the display area and including a gate driving circuit electrically connected to the plurality of gate lines,
wherein:
the gate driving circuit includes a plurality of stages of shift registers,
a shift register includes a plurality of shift register transistors, a gate signal output terminal, and at least one bootstrap point,
the plurality of shift register transistors in the shift register include at least one gate output transistor, and
the at least one gate output transistor includes a gate electrode electrically connected to the at least one bootstrap point, a first electrode electrically connected to the gate signal output terminal, and a gate output active layer comprising polysilicon, wherein a thickness of the gate output active layer is smaller than a thickness of the display active layer.

2. The array substrate according to claim 1, wherein:
the gate output active layer has an electron mobility of P1, and the display active layer has an electron mobility of P2, wherein P1/P2≥10.

3. The array substrate according to claim 2, wherein:
10 cm$^2$/(volt·sec)≤P1≤100 cm$^2$/(volt·sec), and
0.2 cm$^2$/(volt·sec)≤P2≤1.5 cm$^2$/(volt·sec).

4. The array substrate according to claim 1, wherein:
the thickness of the gate output active layer is less than or equal to approximately 3500 Å.

5. The array substrate according to claim 1, wherein:
the at least one gate output transistor has a bottom-gate structure.

6. The array substrate according to claim 1, wherein:
the plurality of stages of shift registers includes a first stage shift register to an N-th stage shift register, where N is an integer, and N≥3;
the plurality of shift register transistors in the shift register include at least one charging transistor and at least one first output transistor, wherein the at least one charging transistor is configured to charge the at least one bootstrap point;
the at least one first output transistor of an X-th stage shift register has a gate electrode electrically connected to the at least one bootstrap point of the X-th stage shift register, and a first electrode electrically connected to a gate electrode of the at least one charging transistor of an (X+1)-th stage shift register, where 1≤X≤N−1;
the at least one first output transistor does not output a scanning signal to a gate line; and
the at least one first output transistor includes a first active layer comprising amorphous silicon.

7. The array substrate according to claim 6, wherein:
the shift register includes a zeroth transistor M0, a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a first capacitor C1 and a second capacitor C2,
wherein:
a gate electrode of the zeroth transistor M0 is electrically connected to a start signal input terminal SET, a first electrode of the zeroth transistor M0 is electrically connected to a first voltage signal input terminal DIR1, and a second electrode of the zeroth transistor M0 is electrically connected to a bootstrap point P;
a gate electrode of the first transistor M1 is electrically connected to a first reset signal input terminal RESET, a first electrode of the first transistor M1 is electrically connected to the bootstrap point P, and a second electrode of the first transistor M1 is electrically connected to a second voltage signal input terminal DIR2;
a gate electrode of the second transistor M2 is electrically connected to a first node N1, a first electrode of the second transistor M2 is electrically connected to the bootstrap point P, and a second electrode of the second transistor M2 is electrically connected to a third voltage signal input VGL2;
a gate electrode of the third transistor M3 is electrically connected to the bootstrap point P, a first electrode of the third transistor M3 is electrically connected to the first node N1, and a second electrode of the third transistor M3 is electrically connected to the third voltage signal input terminal VGL2;
a gate electrode of the fourth transistor M4 is electrically connected to the bootstrap point P, a first electrode of the fourth transistor M4 is electrically connected to a first clock signal input terminal CKB, and a second electrode of the fourth transistor M4 is electrically connected to a first signal output terminal GOUT;
a gate electrode of the fifth transistor M5 is electrically connected to the first node N1, a first electrode of the fifth transistor M5 is electrically connected to the first signal output terminal GOUT, and a second electrode of the fifth transistor M5 is electrically connected to a fourth voltage signal input terminal VGL1;
a gate electrode of the sixth transistor M6 is electrically connected to a second clock signal input terminal CK, a first electrode of the sixth transistor M6 is electrically connected to the first signal output terminal GOUT, and a second electrode of the sixth transistor M6 is electrically connected to a fourth voltage signal input terminal VGL1;

a gate electrode of the seventh transistor M7 is electrically connected to a fifth voltage signal input terminal GOFF, a first electrode of the seventh transistor M7 is electrically connected to the first signal output terminal GOUT, and a second electrode of the seventh transistor M7 is electrically connected to a fourth voltage signal input terminal VGL1;

a gate electrode of the eighth transistor M8 is electrically connected to a second reset signal input RESET-ALL, a first electrode of the eighth transistor M8 is electrically connected to the bootstrap point P, and a second electrode of the eighth transistor M8 is electrically connected to a fourth voltage signal input terminal VGL1;

a gate electrode of the ninth transistor M9 is electrically connected to the bootstrap point P, a first electrode of the ninth transistor M9 is electrically connected to the first clock signal input terminal CKB, and a second electrode of the ninth transistor M9 is electrically connected to a second signal output terminal OUTPUT_SUB;

a gate electrode of the tenth transistor M10 is electrically connected to the second clock signal input terminal CK, a first electrode of the tenth transistor M10 is electrically connected to the second signal output terminal OUTPUT_SUB, and a second electrode of the tenth transistor M10 is electrically connected to the third voltage signal input terminal VGL2;

a gate electrode of the eleventh transistor M11 is electrically connected to the first node N1, a first electrode of the eleventh transistor M11 is electrically connected to the second signal output OUTPUT_SUB, and a second electrode of the eleventh transistor M11 is electrically connected to the third voltage signal input terminal VGL2;

a first plate of the first capacitor C1 is electrically connected to the first clock signal input terminal CKB, and a second plate of the first capacitor C1 is electrically connected to the first node N1;

a first plate of the second capacitor C2 is electrically connected to the bootstrap point P, and a second plate of the second capacitor C2 is electrically connected to the first signal output terminal GOUT; and the at least one gate output transistor includes the fourth transistor M4, and the at least one first output transistor includes the ninth transistor M9.

8. The array substrate according to claim 6, wherein:

the shift register includes a zeroth transistor M0, a first transistor M1 to a twenty-fifth transistor M25, a thirty-ninth transistor M39 to a forty-sixth transistor M46, a first capacitor C1 and a second capacitor C2;

a gate electrode of the zeroth transistor M0 is electrically connected to a first start signal input terminal SET1, a first electrode of the zeroth transistor M0 is electrically connected to a first voltage signal FW, and a second electrode of the zeroth transistor M0 is electrically connected to a first bootstrap point P1;

a gate electrode of the first transistor M1 is electrically connected to a first reset signal input terminal RESET1, a first electrode of the first transistor M1 is electrically connected to a second voltage signal BW, and a second electrode of the first transistor M1 is electrically connected to the first bootstrap point P1;

a gate electrode of the second transistor M2 is electrically connected to a first start signal input terminal SET1, a first electrode of the second transistor M2 is electrically connected to a first node N1, and a second electrode of the second transistor M2 is electrically connected to a second voltage signal input terminal VGL2;

a gate electrode of the third transistor M3 is electrically connected to the first bootstrap point P1, a first electrode of the third transistor M3 is electrically connected to the first node N1, and a second electrode of the third transistor M3 is electrically connected to the second voltage signal input terminal VGL2;

a gate electrode of the fourth transistor M4 is electrically connected to the first node N1, a first electrode of the fourth transistor M4 is electrically connected to the first bootstrap point P1, and a second electrode of the fourth transistor M4 is electrically connected to the second voltage signal input terminal VGL2;

a gate electrode of the fifth transistor M5 is electrically connected to the first node N1, a first electrode of the fifth transistor M5 is electrically connected to a first signal output terminal Gout_n, and a second electrode of the fifth transistor M5 is electrically connected to a first voltage signal input terminal VGL1;

a gate electrode of the sixth transistor M6 is electrically connected to a second node N2, a first electrode of the sixth transistor M6 is electrically connected to the first bootstrap point P1, and a second electrode of the sixth transistor M6 is electrically connected to the second voltage signal input terminal VGL2;

a gate electrode of the seventh transistor M7 is electrically connected to the second node N2, a first electrode of the seventh transistor M7 is electrically connected to the first signal output terminal Gout_n, and a second electrode of the seventh transistor M7 is electrically connected to the first voltage signal input terminal VGL1;

a gate electrode of the eighth transistor M8 is electrically connected to the first bootstrap point P1, a first electrode of the eighth transistor M8 is electrically connected to a first clock signal input terminal CK1, and a second electrode of the eighth transistor M8 is electrically connected to the first signal output terminal Gout_n;

a gate electrode of the ninth transistor M9 is electrically connected to a third voltage signal V1, a first electrode of the ninth transistor M9 is electrically connected to a third node N3, and a second electrode of the ninth transistor M9 is electrically connected to the third voltage signal V1;

a gate electrode of the tenth transistor M10 is electrically connected to the third node N3, a first electrode of the tenth transistor M10 is electrically connected to the third voltage signal V1, and a second electrode of the tenth transistor M10 is electrically connected to the first node N1;

a gate electrode of the eleventh transistor M11 is electrically connected to a second bootstrap point P2, a first electrode of the eleventh transistor M11 is electrically connected to the third node N3, and a second electrode of the eleventh transistor M11 is electrically connected to the second voltage signal terminal VGL2;

a gate electrode of the twelfth transistor M12 is electrically connected to the first bootstrap point P1, a first electrode of the twelfth transistor M12 is electrically connected to the third node N3, and a second electrode of the twelfth transistor M12 is electrically connected to the second voltage signal terminal VGL2;

a gate electrode of the thirteenth transistor M13 is electrically connected to the first node N1, a first electrode of the thirteenth transistor M13 is electrically connected to the first voltage signal input terminal VGL1, and a second electrode of the thirteenth transistor M13 is coupled to a second signal output terminal Gout_n+1;

a gate electrode of the fourteenth transistor M14 is electrically connected to the second bootstrap point P2, a first electrode of the fourteenth transistor M14 is electrically connected to the second signal output terminal Gout_n+1, and a second electrode of the fourteenth transistor M14 is electrically connected to a second clock signal input terminal CK2;

a gate electrode of the fifteenth transistor M15 is electrically connected to the first node N1, a first electrode of the fifteenth transistor M15 is electrically connected to the second voltage signal input terminal VGL2, and a second electrode of the fifteenth transistor M15 is electrically connected to the second bootstrap point P2;

a gate electrode of the sixteenth transistor M16 is electrically connected to the second node N2, a first electrode of the sixteenth transistor M16 is electrically connected to the first voltage signal input terminal VGL1, and a second electrode of the sixteenth transistor M16 may be electrically to the second signal output terminal Gout_n+1;

a gate electrode of the seventeenth transistor M17 is electrically connected to the second node N2, a first electrode of the seventeenth transistor M17 is electrically connected to the second voltage signal input terminal VGL2, and a second electrode of the seventeenth transistor M17 is electrically connected to the second bootstrap point P2;

a gate electrode of the eighteenth transistor M18 is electrically connected to the fourth node N4, a first electrode of the eighteenth transistor M18 is electrically connected to the second node N2, and a second electrode of the eighteenth transistor M18 is electrically connected to a fourth voltage signal V2;

a gate electrode of the nineteenth transistor M19 is electrically connected to the second bootstrap point P2, a first electrode of the nineteenth transistor M19 is electrically connected to the second voltage signal input terminal VGL2, and a second electrode of the nineteenth transistor M19 is electrically connected to a fourth node N4;

a gate electrode of the twentieth transistor M20 is electrically connected to the second bootstrap point P2, a first electrode of the twentieth transistor M20 is electrically connected to the second voltage signal input terminal VGL2, and a second electrode of the twentieth transistor M20 is electrically connected to the second node N2;

a gate electrode of the twenty-first transistor M21 is electrically connected to the first bootstrap point P1, a first electrode of the twenty-first transistor M21 is electrically connected to the second voltage signal input terminal VGL2, and a second electrode of the twenty-first transistor M21 is electrically connected to the fourth node N4;

a gate electrode of the twenty-second transistor M22 is electrically connected to the first start signal input terminal SET1, a first electrode of the twenty-second transistor M22 is electrically connected to the second voltage signal input terminal VGL2, the second terminal of the twenty-second transistor M22 is electrically connected to the second node N2;

a gate electrode of the twenty-third transistor M23 is electrically connected to the fourth voltage signal V2, a first electrode of the twenty-third transistor M23 is electrically connected to the fourth node N4, and a second electrode of the twenty-third transistor M23 is electrically connected to the fourth voltage signal V2;

a gate electrode of the twenty-fourth transistor M24 is electrically connected to a second start signal input SET2, a first electrode of the twenty-fourth transistor M24 is electrically connected to a first voltage signal FW, and the second electrode of the twenty-fourth transistor M24 is electrically connected to the second bootstrap point P2;

a gate electrode of the twenty-fifth transistor M25 is electrically connected to a second reset signal input terminal RESET2, a first electrode of the twenty-fifth transistor M25 is electrically connected to a second voltage signal BW, and a second electrode of the twenty-fifth transistor M25 is electrically connected to the second bootstrap point P2;

a gate electrode of the thirty-ninth transistor M39 is electrically connected to the first bootstrap point P1, a first electrode of the thirty-ninth transistor M39 is electrically connected to the first clock signal input terminal CK1, and a second electrode of the thirty-ninth transistor M39 is electrically connected to a third signal output terminal Gout_sub_n;

a gate electrode of the fortieth transistor M40 is electrically connected to the second node N2, a first electrode of the fortieth transistor M40 is electrically connected to the third signal output terminal Gout_sub_n, and a second electrode of the fortieth transistor M40 is electrically connected to the second voltage signal input terminal VGL2;

a gate electrode of the forty-first transistor M41 is electrically connected to the first node N1, a first electrode of the forty-first transistor M41 is electrically connected to the third signal output terminal Gout_sub_n, and a second electrode of the forty-first transistor M41 is electrically connected to the second voltage signal input terminal VGL2;

a gate electrode of the forty-second transistor M42 is electrically connected to the second bootstrap point P2, a first electrode of the forty-second transistor M42 is electrically connected to a fourth signal output terminal Gout_sub_n+1, and a second electrode of the forty-second transistor M42 is electrically connected to the second clock signal input terminal CK2;

a gate electrode of the forty-third transistor M43 is electrically connected to the second node N2, a first electrode of the forty-third transistor M43 is electrically connected to the second voltage signal input terminal VGL2, and a second electrode of the forty-third transistor M43 is electrically connected to the fourth signal output terminal Gout_sub_n+1;

a gate electrode of the forty-fourth transistor M44 is electrically connected to the first node N1, a first electrode of the forty-fourth transistor M44 is electrically connected to the second voltage signal input terminal VGL2, and a second electrode of the forty-fourth transistor M44 is electrically connected to the fourth signal output terminal Gout_sub_n+1;

a gate electrode of the forty-fifth transistor M45 is electrically connected to a third reset signal input terminal RESET_all, a first electrode of the forty-fifth transistor M45 is electrically connected to the second voltage signal input terminal VGL2, and a second electrode of the forty-fifth transistor M45 is electrically connected to the second bootstrap point P2;

a gate electrode of the forty-sixth transistor M46 is electrically connected to the third reset signal input terminal RESET_all, a first electrode of the forty-sixth transistor M46 is electrically connected to the first bootstrap point P1, and a second electrode of the forty-sixth transistor M46 is electrically connected to the second voltage signal input terminal VGL2;

a first plate of the first capacitor C1 is electrically connected to the first bootstrap point P1, and a second plate of the first capacitor C1 is electrically connected to the first signal output terminal Gout_n;

a first plate of the second capacitor C2 is electrically connected to the second bootstrap point P2, and the second plate of the second capacitor C2 is electrically connected to the second signal output Gout_n+1; and the at least one gate output transistor includes the eighth transistor M8 and the fourteenth transistor M14, and the at least one first output transistor includes the thirty-ninth transistor M39 and the forty-second transistor M42.

9. The array substrate according to claim 1, wherein:
the plurality of shift register transistors in the shift register include at least one charging transistor configured charge the at least one bootstrap point; and
the at least one charging transistor includes a charging active layer comprising amorphous silicon.

10. The array substrate according to claim 9, wherein:
the shift register includes a zeroth transistor M0, a first transistor M1, a second transistor M2, a third transistor M3, a fourth transistor M4, a fifth transistor M5, a sixth transistor M6, a seventh transistor M7, an eighth transistor M8, a first capacitor C1 and a second capacitor C2, wherein:

a gate electrode of the zeroth transistor M0 is electrically connected to a start signal input terminal STV, a first electrode of the zeroth transistor M0 is electrically connected to a first voltage signal input terminal DIR1 of the zeroth transistor M0, and a second electrode of the zeroth transistor M0 is electrically connected to a bootstrap point P;

a gate electrode of the first transistor M1 is electrically connected to a first voltage signal input terminal G(n+1) of the first transistor M1, a first electrode of the first transistor M1 is electrically connected to the bootstrap point P, and a second electrode of the first transistor M1 may be electrically to a second voltage signal input terminal DIR2 of the first transistor M1;

a gate electrode of the second transistor M2 is electrically connected to a first node N1, the first electrode of the second transistor M2 is electrically connected to the bootstrap point P, and a second electrode of the second transistor M2 is electrically connected to a second voltage signal input terminal VGL of the second transistor M2;

a gate electrode of the third transistor M3 is electrically connected to the bootstrap point P, a first electrode of the third transistor M3 is electrically connected to the first node N1, and a second electrode of the third transistor M3 is electrically connected to the second voltage signal input terminal VGL;

a gate electrode of the fourth transistor M4 is electrically connected to the bootstrap point P, a first electrode of the fourth transistor M4 is electrically connected to a first clock signal input terminal CKB, and a second electrode of the fourth transistor M4 is electrically connected to a first signal output terminal Gn;

a gate electrode of the fifth transistor M5 is electrically connected to the first node N1, a first electrode of the fifth transistor M5 is electrically connected to the first signal output terminal Gn, and a second electrode of the fifth transistor M5 is electrically connected to the second voltage signal input terminal VGL;

a gate electrode of the sixth transistor M6 is electrically connected to a second clock signal input terminal CK, a first electrode of the sixth transistor M6 is electrically connected to the first signal output terminal Gn, and a second electrode of the sixth transistor M6 is electrically connected to the second voltage signal input terminal VGL;

a gate electrode of the seventh transistor M7 is electrically connected to a first reset signal input terminal RESET, a first electrode of the seventh transistor M7 is electrically connected to the bootstrap point P, and a second electrode of the seventh transistor M7 is electrically connected to the second voltage signal input terminal VGL;

a gate electrode of the eighth transistor M8 is electrically connected to the first reset signal input terminal RESET, a first electrode of the eighth transistor M8 is electrically connected to the first signal output terminal Gn, and a second electrode of the eighth transistor M8 is electrically connected to the second voltage signal input terminal VGL;

a first plate of the first capacitor C1 is electrically connected to the first clock signal input terminal CKB, and a second plate of the first capacitor C1 is electrically connected to the first node N1;

a first plate of the second capacitor C2 is electrically connected to the bootstrap point P, and a second plate of the second capacitor C2 is electrically connected to the first signal output terminal Gn; and the at least one charging transistor includes the zeroth transistor M0 and the first transistor M1, and the at least one gate output transistor includes the fourth transistor M4.

11. The array substrate according to claim 1, wherein:
the gate driving circuit has a forward scan function;
the plurality of stages of shift registers include a first stage shift register to an N-th stage shift register, where N is an integer and N≥3;
the plurality of shift register transistors in the shift register include a first charging transistor and a second charging transistor both for charging the at least one bootstrap point;
a gate electrode of the first charging transistor in an X-th stage shift register is electrically connected to the gate signal output terminal of an (X−1)-th stage shift register, and a gate electrode of the second charging transistor of the X-th stage of shift register is electrically connected to the gate signal output terminal of an (X+1)-th stage shift register, where 2≤X≤N−1;
the first charging transistor includes a first charging active layer comprising amorphous silicon; and
the second charging transistor includes a second charging active layer comprising polysilicon.

12. The array substrate according to claim 11, wherein:
the shift register includes a zeroth transistor M0, a first transistor M1, a second transistor M2, a third transistor M3, a fourth transistor M4, a fifth transistor M5, a sixth transistor M6, a seventh transistor M7, an eighth transistor M8, a first capacitor C1 and a second capacitor C2, wherein:

a gate electrode of the zeroth transistor M0 is electrically connected to a start signal input terminal STV, a first electrode of the zeroth transistor M0 is electrically connected to a first voltage signal input terminal DIR1, and a second electrode of the zeroth transistor M0 is electrically connected to a bootstrap point PU;

a gate electrode of the first transistor M1 is electrically connected to a first voltage signal input terminal G(n+1), a first electrode of the first transistor M1 is electrically connected to the bootstrap point PU, and a second electrode of the first transistor M1 may be electrically to a second voltage signal input terminal DIR2;

a gate electrode of the second transistor M2 is electrically connected to a first node PD, a first electrode of the second transistor M2 is electrically connected to the bootstrap point PU, and a second electrode of the second transistor M2 is electrically connected to the second voltage signal input terminal VGL;

a gate electrode of the third transistor M3 is electrically connected to the bootstrap point PU, a first electrode of the third transistor M3 is electrically connected to the first node PD, and a second electrode of the third transistor M3 is electrically connected to the second voltage signal input terminal VGL;

a gate electrode of the fourth transistor M4 is electrically connected to the bootstrap point PU, a first electrode of the fourth transistor M4 is electrically connected to a first clock signal input terminal CKB, and a second electrode of the fourth transistor M4 is electrically connected to a first signal output terminal Gn;

a gate electrode of the fifth transistor M5 is electrically connected to the first node PD, a first electrode of the fifth transistor M5 is electrically connected to the first signal output terminal Gn, and a second electrode of the fifth transistor M5 is electrically connected to the second voltage signal input terminal VGL;

a gate electrode of the sixth transistor M6 is electrically connected to a second clock signal input terminal CK, a first electrode of the sixth transistor M6 is electrically connected to the first signal output terminal Gn, and a second electrode of the sixth transistor M6 may be electrically to the second voltage signal input terminal VGL;

a gate electrode of the seventh transistor M7 is electrically connected to a first reset signal input terminal RESET, a first electrode of the seventh transistor M7 is electrically connected to the bootstrap point PU, and a second electrode of the seventh transistor M7 is electrically connected to the second voltage signal input terminal VGL;

a gate electrode of the eighth transistor M8 is electrically connected to the first reset signal input terminal RESET, a first electrode of the eighth transistor M8 is electrically connected to the first signal output terminal Gn, and a second electrode of the eighth transistor M8 is coupled to the second voltage signal input terminal VGL;

a first plate of the first capacitor C1 is electrically connected to the first clock signal input terminal CKB, and a second plate of the first capacitor C1 is electrically connected to the first node PD;

a first plate of the second capacitor C2 is electrically connected to the bootstrap point P, and a second plate of the second capacitor C2 is electrically connected to the first signal output terminal Gn, and the first charging transistor includes the zeroth transistor M0, the second charging transistor includes the first transistor M1, and the at least one gate output transistor includes a fourth transistor M4.

13. The array substrate according to claim 1, wherein:

the plurality of stages of shift registers are arranged in a first direction; and the at least one gate output transistor in each shift register of the plurality of stages of shift registers is arranged in the first direction.

14. The array substrate according to claim 1, wherein:

in the shift register, the shift register transistors other than the at least one gate output transistor each includes an active layer comprising amorphous silicon.

15. A display panel, comprising:

an array substrate, comprising:

a display area including a plurality of display transistors and a plurality of gate lines, wherein a display transistor includes a display active layer comprising amorphous silicon; and a non-display area surrounding the display area and including a gate driving circuit electrically connected to the plurality of gate lines, wherein:

the gate driving circuit includes a plurality of stages of shift registers, a shift register includes a plurality of shift register transistors, a gate signal output terminal, and at least one bootstrap point, the plurality of shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon, wherein a thickness of the gate output active layer is smaller than a thickness of the display active layer.

16. A display device, comprising:

a display panel, wherein the display panel comprises:

a display area including a plurality of display transistors and a plurality of gate lines, wherein a display transistor includes a display active layer comprising amorphous silicon; and a non-display area surrounding the display area and including a gate driving circuit electrically connected to the plurality of gate lines, wherein:

the gate driving circuit includes a plurality of stages of shift registers, a shift register includes a plurality of shift register transistors, a gate signal output terminal, and at least one bootstrap point, the plurality of shift register transistors in the shift register include at least one gate output transistor, and the at least one gate output transistor includes a gate electrode electrically connected to the at least one bootstrap point, a first electrode electrically connected to the gate signal output terminal, and a gate output active layer comprising polysilicon,
wherein a thickness of the gate output active layer is smaller than a thickness of the display active layer.

\* \* \* \* \*